(12) United States Patent
Ozawa

(10) Patent No.: US 9,685,607 B2
(45) Date of Patent: Jun. 20, 2017

(54) NON-VOLATILE SEMICONDUCTOR MEMORY DEVICE

(71) Applicant: KABUSHIKI KAISHA TOSHIBA, Tokyo (JP)

(72) Inventor: Yoshio Ozawa, Yokkaichi Mie (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 74 days.

(21) Appl. No.: 14/637,139

(22) Filed: Mar. 3, 2015

(65) Prior Publication Data

US 2015/0263277 A1 Sep. 17, 2015

Related U.S. Application Data

(60) Provisional application No. 61/950,905, filed on Mar. 11, 2014.

(51) Int. Cl.
*H01L 45/00* (2006.01)
*H01L 27/24* (2006.01)

(52) U.S. Cl.
CPC .......... *H01L 45/085* (2013.01); *H01L 27/249* (2013.01); *H01L 27/2481* (2013.01); *H01L 45/1226* (2013.01); *H01L 45/1233* (2013.01); *H01L 45/1266* (2013.01); *H01L 45/1273* (2013.01); *H01L 45/145* (2013.01); *H01L 45/1616* (2013.01)

(58) Field of Classification Search
None
See application file for complete search history.

(56) References Cited

U.S. PATENT DOCUMENTS

| | | | |
|---|---|---|---|
| 8,895,953 B1* | 11/2014 | Shields | H01L 45/085 257/2 |
| 2011/0193044 A1* | 8/2011 | Sandhu | H01L 45/085 257/2 |
| 2013/0037772 A1* | 2/2013 | Sills | H01L 45/085 257/2 |
| 2013/0126816 A1* | 5/2013 | Tang | H01L 27/2463 257/3 |

* cited by examiner

*Primary Examiner* — Whitney T Moore
*Assistant Examiner* — Scott R Wilson
(74) *Attorney, Agent, or Firm* — Patterson & Sheridan, LLP

(57) ABSTRACT

A non-volatile semiconductor memory device according to an embodiment includes a plurality of first wiring lines that extend in a first direction, a plurality of second wiring lines that extend in a second direction intersecting the first direction to cross the first wiring lines, and memory cells, each of which is provided at a portion where the first wiring line crosses the second wiring line. The memory cell includes a variable resistance layer in the space between the wiring lines where the first wiring line crosses the second wiring line, a seam in the variable resistance layer extending in a direction between the first wiring layer and the second wiring layer, and a metal supply layer that comes in contact with the variable resistance layer and the seam.

15 Claims, 25 Drawing Sheets

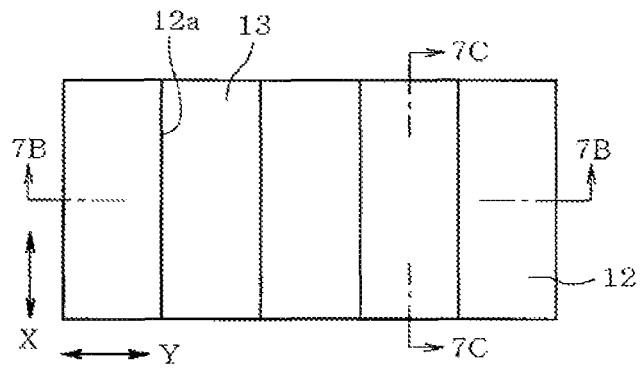
FIG. 7A
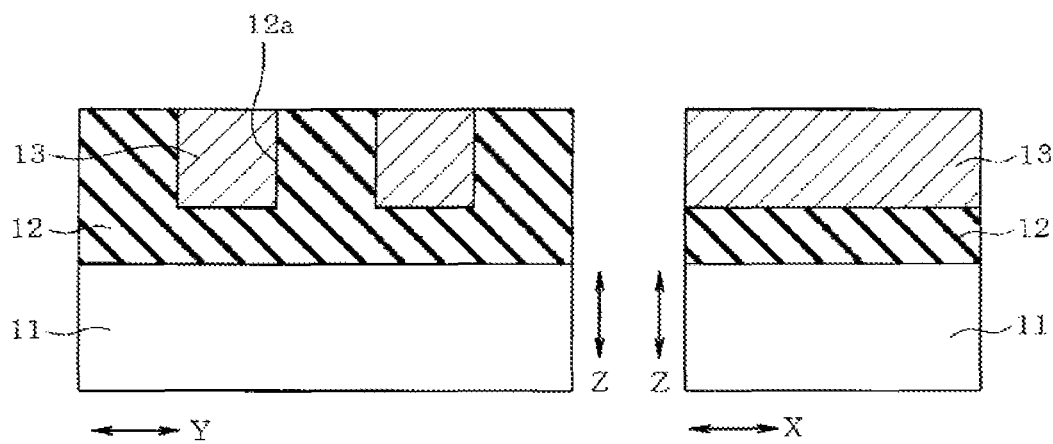
FIG. 7B　　　FIG. 7C

NON-VOLATILE SEMICONDUCTOR MEMORY DEVICE

CROSS-REFERENCE TO RELATED APPLICATION

This application is based upon and claims the benefit of priority from U.S. Provisional Patent Application No. 61/950,905, filed Mar. 11, 2014, the entire contents of which are incorporated herein by reference.

FIELD

Exemplary embodiments described herein relate to a non-volatile semiconductor memory device.

BACKGROUND

There is a conductive bridging RAM as a non-volatile semiconductor memory device. The conductive bridging RAM is a non-volatile semiconductor memory device which uses a change in the resistance value of a memory cell when a voltage is applied to the variable resistance layer. In such a conductive bridging RAM, it is difficult to reduce variations in characteristics between memory different cells.

BRIEF DESCRIPTION OF THE DRAWINGS

FIG. 7A is a schematic plan view illustrating an example of the memory cells MR in one stage of a manufacturing process.

FIG. 7B is a longitudinal sectional view illustrating an example of a portion shown by the line 7B-7B of FIG. 7A in one stage of the manufacturing process.

FIG. 7C is a longitudinal sectional view illustrating an example of a portion shown by the line 7C-7C of FIG. 7A in one stage of the manufacturing process.

DETAILED DESCRIPTION

According to an embodiment, a memory array includes a plurality of first wiring lines that extend in a first direction, a plurality of second wiring lines that extend in a second direction intersecting the first direction to cross the first wiring lines, and memory cells, each of which is provided where the second wiring line overlies or underlies the first wiring line. The memory cells include a variable resistance layer in the portion where the first wiring line crosses the second wiring line, a seam, where portions of a material forming at least a portion of the variable resistance layer are in contact with each other, extending in a direction along which the first wiring line and the second wiring line are spaced from one another, and a metal supply layer contacting the variable resistance layer and the seam.

First Embodiment

Hereinafter, a first embodiment applied to a conductive bridging RAM device will be described with reference to FIGS. 1 to 10. The drawings are schematic drawings, and the relationships between thicknesses and plane dimensions, ratios of thicknesses of the respective layers, and the like do not necessarily coincide with those of an actual device. In addition, the directions of upward, downward, leftward, and rightward indicate relative directions when a circuit forming surface side of a semiconductor substrate, to be described later herein, is defined as an upper side, and do not necessarily coincide with directions based on the gravitational acceleration direction.

Figure 1:
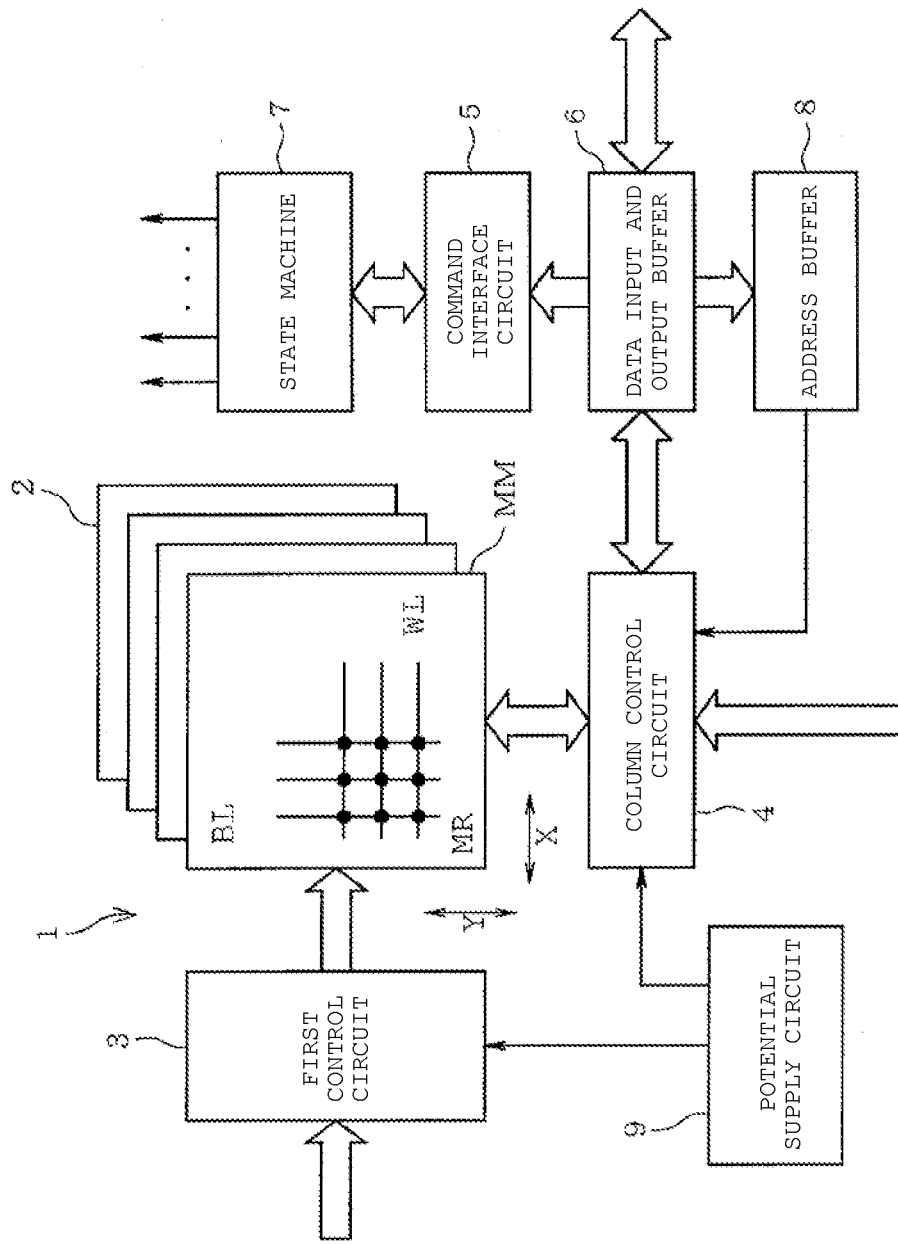
FIG. 1 is a schematic diagram illustrating an example of an electrical configuration according to a first embodiment.

FIG. 1 illustrates a schematic block configuration of a conductive bridging RAM (CBRAM, hereinafter, referred to as "resistance change memory") 1. The conductive bridging RAM 1 is provided with a cross-point memory cell array 2 in which memory elements storing information by changing a resistance value are disposed in a three-dimensional lattice. The memory cell array 2 has a configuration in which a plurality of memory cell layers Mare formed one over the other. Each memory cell layer MM is provided with a plurality of bit lines BL, a plurality of word lines WL, and a plurality of memory cells MR.

As shown schematically in FIG. 1, the plurality of bit lines BL are disposed to extend in the first direction. A plurality of word lines WL extend in the second direction perpendicular to the first direction and are configured to cross the plurality of bit lines BL. A memory cell MR is disposed at, and extends between, each crossing location of the word line WL and the bit line BL. In addition, by laminating together a plurality of memory cell chips MM, the memory cell array 12 has memory cells MR disposed in a three-dimensional lattice structure.

A column control circuit 4 is electrically connected to the bit lines BL of the memory cell chips MM. The column control circuit 4 has a bit line driver and a sense amplifier. The bit line driver BD supplies a predetermined voltage to the bit line BL based on a column address signal. Accordingly, the column control circuit 14 performs data erasing on, and data writing to, the memory cell MR, and data reading from the memory cell. The sense amplifier SA determines data stored in the memory cell MR by detecting and amplifying a current flowing to the memory cell MR during a data reading operation.

Each memory cell layer MM of the memory cell array 2 is connected to a first control circuit 3 on one end side thereof in an X-direction which is the first direction, and is connected to a second control circuit 4 on one end side thereof in a Y-direction which is the second direction intersecting the first direction. The first control circuit 3 selects a row of the memory cell layer MM of the memory cell array 2 based on a row address signal. The second control circuit 4 selects a column of the memory cell mat MM based on a column address signal. The first control circuit 3 and the second control circuit 4 control data writing, erasing, and reading on the memory cell MR of each of the memory cell layers MM of the memory cell array 2.

In this embodiment, in the memory cell MR of the resistance change memory 1, for example, writing is called setting, and erasing is called resetting. In this case, regarding a resistance value of the memory cell MR, the value in a setting state may be different from a value in a resetting state. That is, it does not matter whether the resistance value in the setting state is higher or lower than the resistance value in the resetting state. The memory cell MR may have a configuration of multivalued resistance change memory capable of taking on, i.e., having, a plurality of resistance value levels.

The resistance change memory 1 is supplied with a control signal and data for internal control from the outside thereof. A controller which supplies the control signal and data may be disposed inside the resistance change memory 1, or inside a separate chip (host device). The control signal is input to a command interface circuit 5, and the data is input to a data input and output buffer 6.

The command interface circuit 5 determines whether the input data is command data based on the control signal. When the input data is command data, the command interface circuit 5 transmits the data from the data input and output buffer 6 to a state machine 7.

The state machine 7 manages operations of the resistance change memory 1 based on the command data. For example, the state machine 7 manages a setting or resetting operation, and a reading operation based on the command data from the controller. The controller may also receive status information managed by the state machine 7 to evaluate results of the operation in the resistance change memory 1. In the setting or resetting operation and in the reading operation, the controller supplies an address signal to the resistance change memory 1. The address signal is input to the first control circuit 3 and the second control circuit 4 through an address buffer 8. A potential supply circuit 9 outputs, for example, a voltage pulse or a current pulse necessary for the setting or resetting operation and the reading operation at a predetermined time based on a command from the state machine 7. The potential supply circuit 9 includes a pulse generator and controls, in accordance with an operation represented by a command data and a control signal, a voltage value or a current value and a pulse width of a voltage pulse or a current pulse to be output therefrom.

Figure 2:
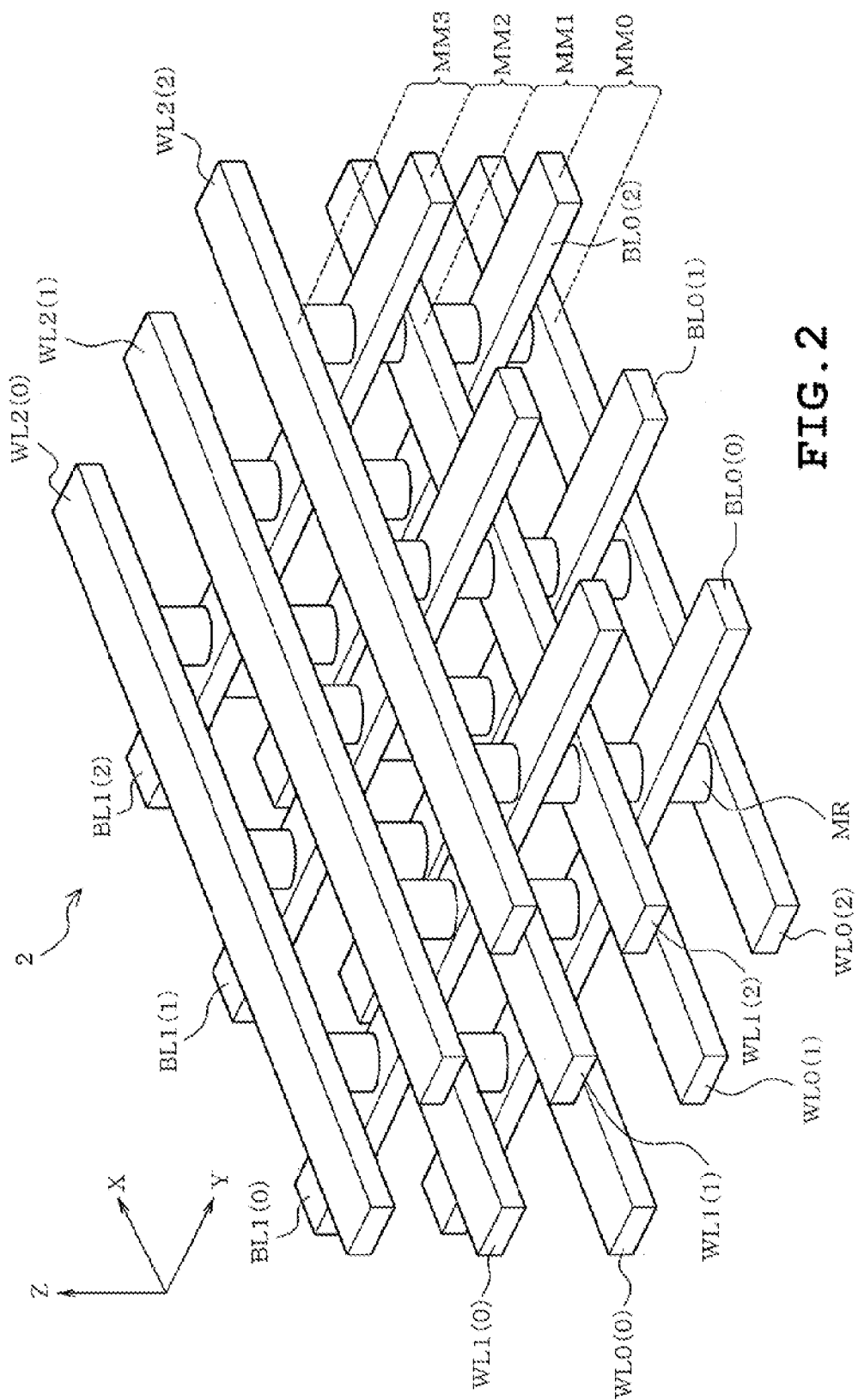
FIG. 2 is a diagram schematically illustrating an example of a configuration of a portion of a memory cell portion.

FIG. 2 is a schematic perspective diagram illustrating an example of an electrical structure of the memory cell array 2. The memory cell array 2 illustrated in FIG. 2 has a cross-point structure. The cross-point memory cell array 2 is formed or located on a substrate such as silicon substrate. When the memory cell array 2 is provided on an interlayer insulating film formed on a substrate, a peripheral circuit of the memory cell array 2 may be formed adjacent to the memory cell array on the same side of the substrate.

The memory cell array 2 has a configuration in which the memory cell layers MM are disposed one over the other in a Z-direction which is the third direction. The memory cell layers MM are stacked such that, for example, memory cell layers MM0, MM1, MM2, MM3, and the like are stacked on each other beginning at the surface of the substrate. In this case, the number of the memory cell layers MM may be two or more. The cross-point memory cell array 2 may also be composed of one memory cell layer. An insulating film may be provided between the wiring lines (the word lines WL and bit lines BL) of two adjacent memory cell layers MM (n) and MM (n+1) (n=0, 1, 2, and the like) to electrically separate the two bit lines BL, word lines WL and the individual memory cells MM of the memory cell array from each other.

When the plurality of memory cell layers MM0, MM1, MM2, and MM3 are stacked as shown in FIG. 2, the address signal includes, for example, a memory cell layer selection signal, a row address signal, and a column address signal. For example, based on the memory cell layer selection signal, the first control circuit 3 and the second control circuit 4 select one of the plurality of laminated memory cell layers MM. The first control circuit 3 and the second control circuit 4 may perform data writing, erasing, and reading on one of the plurality of laminated memory cell layers MM, or may simultaneously perform data writing, erasing, and reading on two or more or all of the plurality of laminated memory cell layers MM.

Each of the memory cell layers MM0 to MM3 has a plurality of memory cells MR disposed in an array or matrix in the X-direction and in the Y-direction. Specifically, the memory cell layer MM0 has a plurality of memory cells MR0, the memory cell layer MM1 has a plurality of memory cells MR1, the memory cell layer MM2 has a plurality of memory cells MR2, and the memory cell layer MM3 has a plurality of memory cells MR3. On the substrate, word lines WL and bit lines BL are alternately formed one above the other in the Z-direction from the substrate. The word lines WL are disposed to extend in the X-direction, and the bit lines BL are disposed to extend in the Y-direction with a layer interposed therebetween where the memory cells MR are formed.

In this case, the word lines WL are disposed so that word lines WL0, WL1, WL2, and the like are positioned in order from the substrate surface, and the bit lines BL are disposed so that bit lines BL0, BL1, BL2, and the like are positioned in order from the substrate surface in the same manner. In addition, the memory cell layer MM0 includes the memory cells MR0, the lower word lines WL0, and the upper bit lines BL0, and the memory cell layer MM1 includes the memory cells MR1, the lower bit lines BL0, and the upper word lines WL1. Hence each memory cell layer MM, except the lowermost (closest to the substrate surface) and uppermost (furthest from the substrate surface) shares a word line WL and a bit line BL with an adjacent memory cell layer MM thereabove and therebelow.

Similarly, an even number-th memory cell layer MMk (k is an even number) includes memory cells MRk, lower word lines WLk, and upper bit lines BLk, and an odd number-th memory cell layer MMk+1 includes memory cells MRk+1, the lower bit lines BLk, and upper word lines WLk+1. Furthermore, the respective word lines WL0, WL1, and the like are disposed so that word lines WL0(0), WL0(1), and the like and word lines WL1(0), WL1(1), and the like are respectively disposed in the same memory layer. Similarly, the respective bit lines BL0, BL1, and the like are disposed so that bit lines BL0(0), BL0(1), and the like and bit lines BL1(0), BL1(1), and the like are respectively disposed in the same memory cell layer. Each memory cell MR is disposed at a crossing location, i.e., a crossing-point between the upper and lower word line WL and bit line BL.

Other than the configuration in which the memory cell layer MM adjacent to each other in the vertical direction share the word lines WL or the bit lines BL as described above, a configuration in which an insulating film is provided between the memory cell layers MM to provide separate word lines WL and bit lines BL may also be employed.

Figure 3:
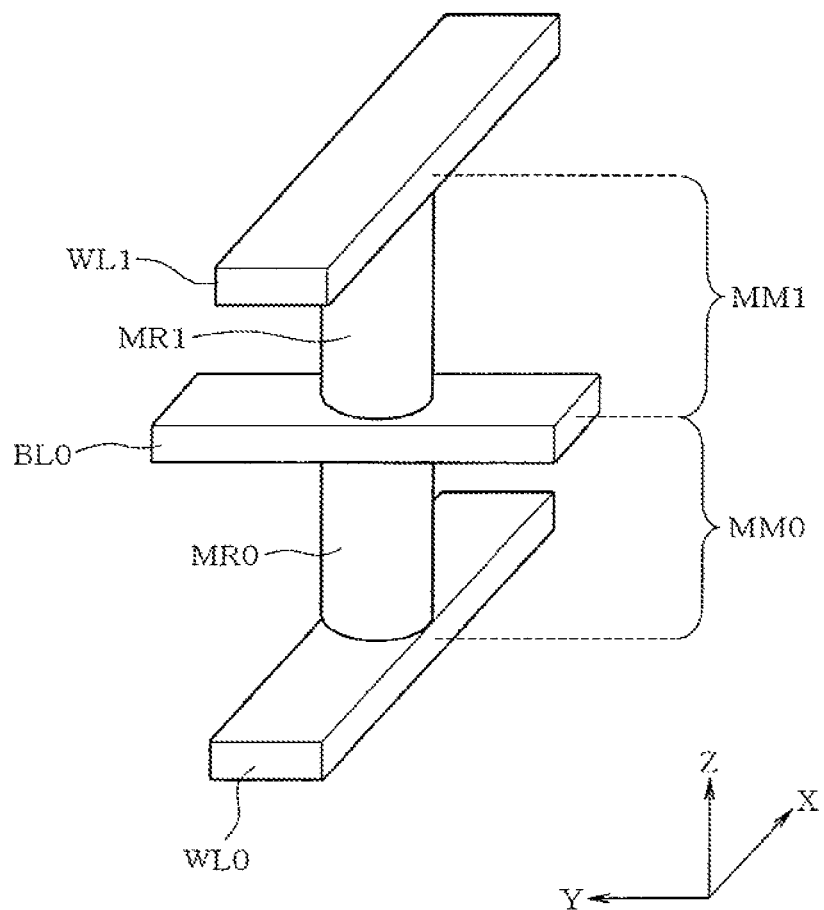
FIG. 3 is a diagram illustrating an example of a configuration of a memory cell.

FIG. 3 illustrates an example of the wiring lines between the memory cell layers MM at a crossing-point in a conductive bridging RAM 1, and of a basic configuration of the structure of the memory cell MR. Here, the memory cells MR0 and MR1 in the two adjacent memory cell layers MM0 and MM1 in FIG. 2 are illustrated. In this case, the configurations of the memory cells MR2 and MR3 in the two memory cell layers MM2 and MM3 in FIG. 2 are the same as those of the memory cells MR0 and MR1 in the two memory cell layers MM0 and MM1 in FIG. 2.

The memory cell MR0 is provided at the crossing location of the word line WL0 and the bit line BL0, and the memory cell MR1 is provided at the crossing location of the bit line BL0 and the word line WL1. Similarly, each of the memory cells MR2 and MR3 of the upper memory cell layers MM are disposed at locations where the word lines WL and the bit lines BL cross over each other. In addition, as for each of these memory cells MR0 to MR3, a corresponding memory cell MR for setting, unsetting or reading may be selected by selecting the appropriate word line WL and bit line BL crossing at that memory cell MR location.

Figure 4A:
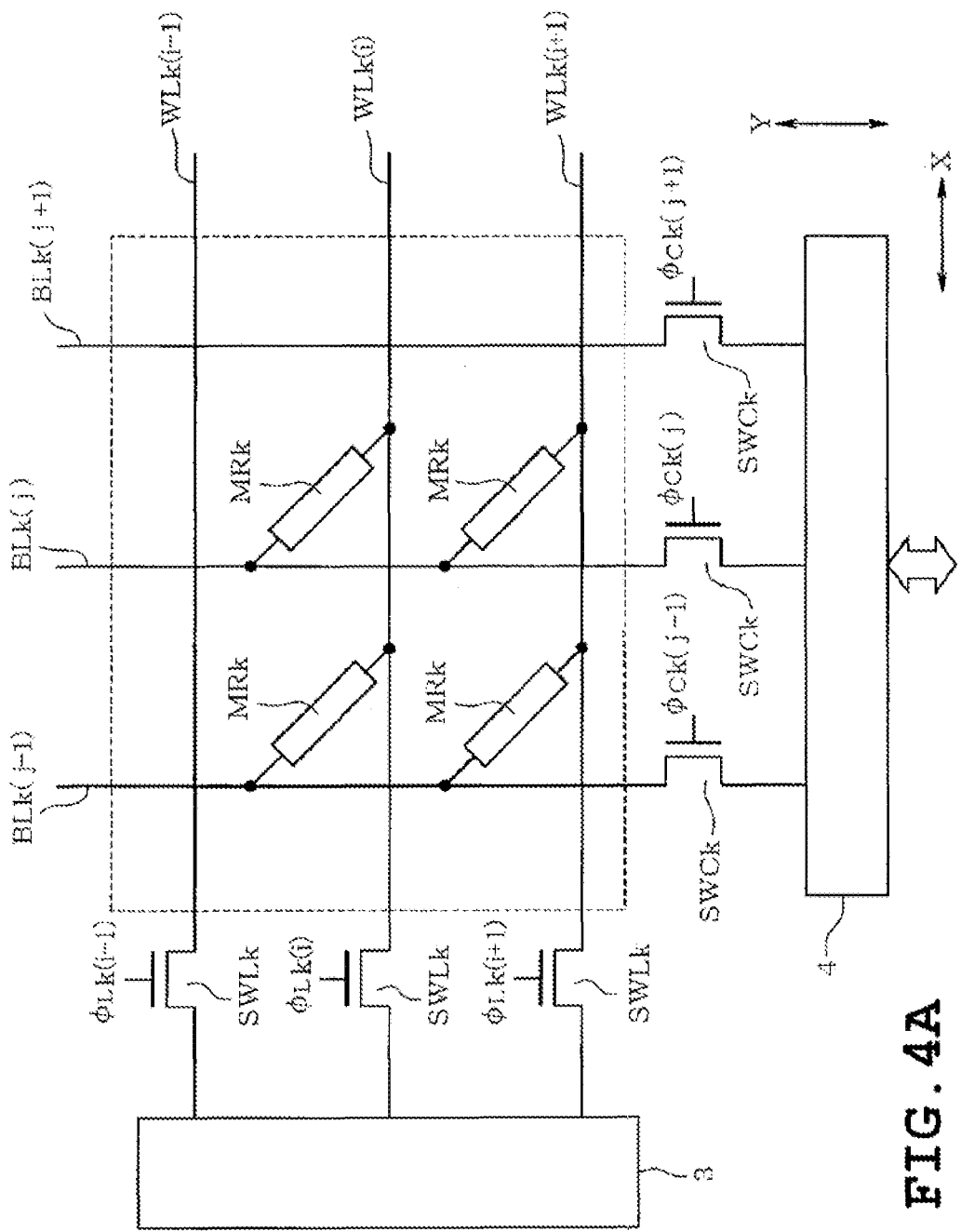
FIG. 4A is a diagram illustrating a (first) example of the layout of first and second control circuits.
Figure 4B:
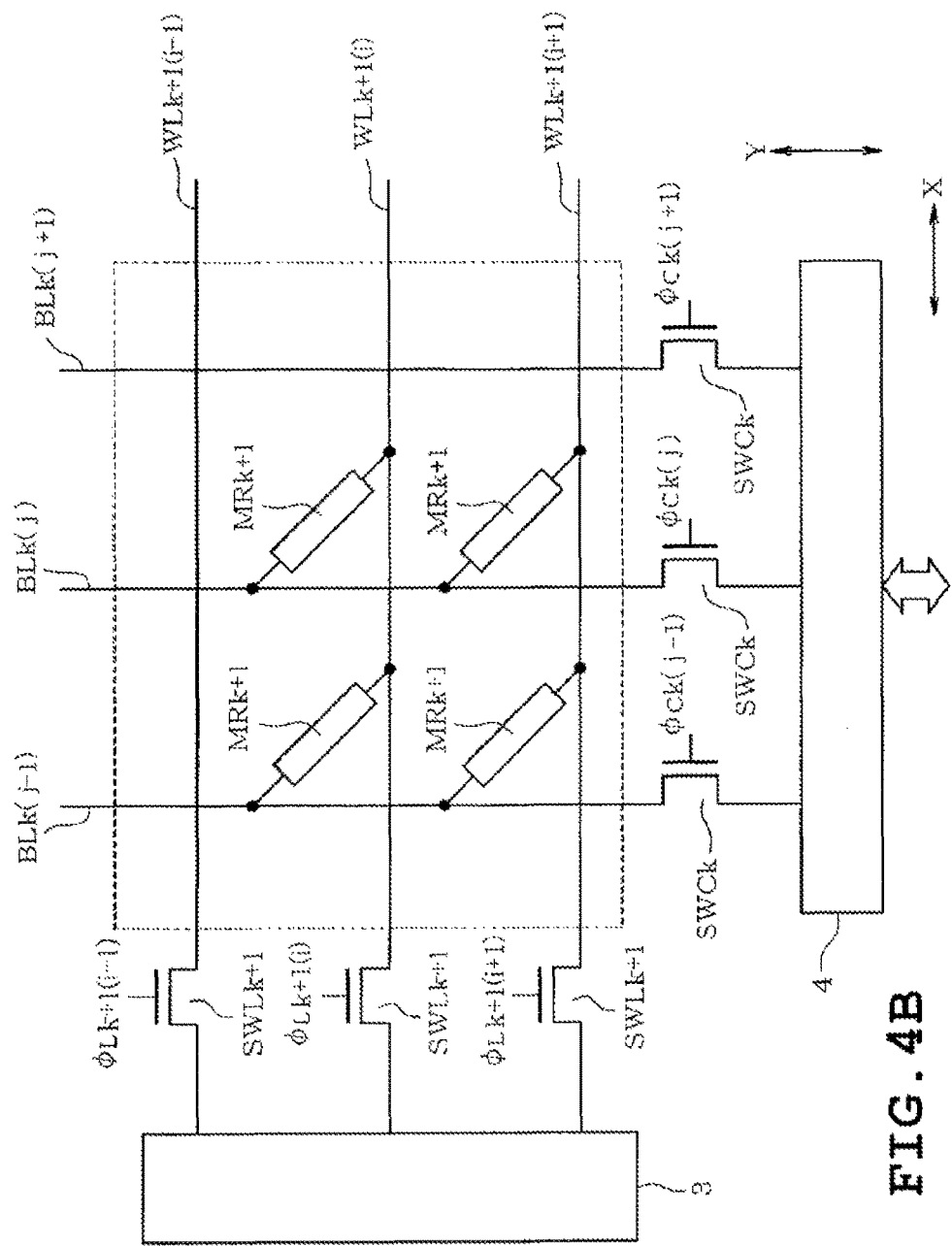
FIG. 4B is a diagram illustrating a (second) example of the layout of the first and second control circuits.

FIGS. 4A and 4B illustrate an example of the layout of the first control circuit 3 and the second control circuit 4 provided with respect to the memory cell array 2. FIG. 4A illustrates a memory cell level MMk (k is 0 or an even number) corresponding to any one of the memory cell layers MM0 and the memory cell layer MM2 which is an even number-th layer illustrated in FIG. 2. As illustrated in FIG. 4A, the memory cell layer MMk is composed of a plurality of memory cells MRk disposed in an array or matrix format. One end of each memory cell MRk is connected to one of the word lines WLk(i−1), WLk(i), and WLk(i+1). The other end of each of the memory cells MRk is connected to one of the bit lines BL0(j−1), BL0(j), and BL0(j+1).

A memory cell layer MMk+1 (k is 0 or an odd number) which is an odd number-th layer is composed of a plurality of memory cells MRk+1 disposed in an array or matrix format as illustrated in FIG. 4B. One end of each of the memory cells MRk+1 is connected to one of the word lines WLk+1 (i−1), WLk+1 (i), and WLk+1 (i+1). The other end of each of the memory cell MRk+1 is connected to one of the bit lines BLk(j−1), BLk(j), and BLk(j+1).

One end of the word lines WLk(i−1), WLk(i), and WLk (i+1) in the X-direction are connected to the first control circuit 3 through switch elements SWLk(i−1), SWLk(i), and SWLk(i+1). The switch elements SWLk are controlled by, for example, control signals ϕLK(i−1), ϕLK(i), and ϕLK(i+1), respectively. The switch element SWLk is composed of, for example, an N-channel field effect transistor (FET).

One end of the word lines WLk+1 (i−1), WLk+1 (i), and WLk+1 (i+1) in the X-direction are connected to the first control circuit 3 through switch elements SWLk+1 (i−1), SWLk+1 (i), and SWLk+1 (i+1). The switch elements SWLk+1 are controlled by, for example, control signals φLk+1 (i−1), φLk+1 (i), and φLk+1 (i+1), respectively. The switch element SWLk+1 is composed of, for example, an N-channel FET.

One end of the bit lines BLk(j−1), BLk(j), and BLk(j+1) in the Y-direction are connected to the second control circuit 4 through switch elements SWCk. The switch elements SWCk are controlled by, for example, control signals φCK (j−1), φCK(j), and φCK(j+1), respectively. The switch element SWCk is composed of, for example, an N-channel FET.

Figure 5:
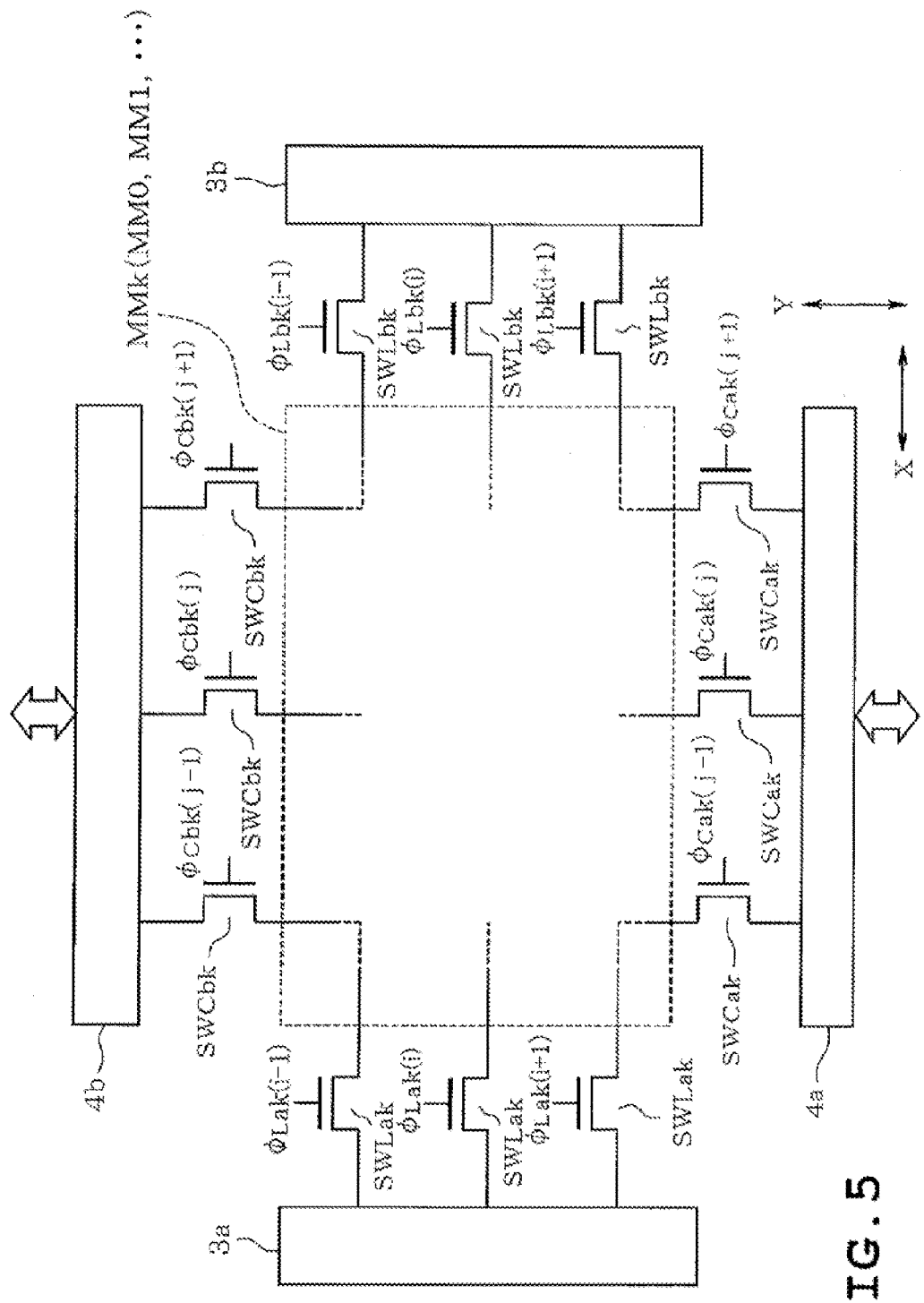
FIG. 5 is a diagram illustrating a different example of the layout of the first and second control circuits.

FIG. 5 illustrates an alternative layout of the first control circuit 3 and the second control circuit 4. In FIG. 5, the internal configuration of a memory cell layer MMk illustrated as a representative of the stacked memory cell layers MM0, MM1, and the like is substantially the same as those of the memory cell layers MMk illustrated in FIGS. 4A and 4B, and the internal configuration of the memory cell layer MMk is omitted in FIG. 5.

The layout illustrated in FIG. 5 is different from the layouts illustrated in FIGS. 4A and 4B in that first control circuits 3a and 3b are disposed at both ends of each memory cell layer MMk in the X-direction and second control circuits 4a and 4b are disposed at both ends of each memory cell layer MMk in the Y-direction.

Both ends of each of word lines WLk(i−1), WLk(i), and WLk(i+1) in the X-direction are connected to the first control circuit 3a through a switch element SWLak and to the first control circuit 3b through a switch element SWLbk, respectively. For example, control signals φLak(i−1), φLak (i), and φLak(i+1) are applied to the switch elements SWLak, and for example, control signals φLbk(i−1), φLbk (i), and φLbk(i+1) are applied to the switch elements SWLbk to perform ON-OFF control. The switch elements SWLak and SWLbk are each composed of, for example, an N-channel FET.

Both ends of each of bit lines BLk(j−1), BLk(j), and BLk(j+1) in the Y-direction are connected to the second control circuit 4a through a switch element SWCak and to the second control circuit 4b through a switch element SWCbk, respectively. For example, control signals φCak(j−1), φCak(j), and φCak(j+1) are applied to the switch elements SWCak, and for example, control signals φCbk(j−1), φCbk(j), and φCbk(j+1) are applied to the switch elements SWCbk to perform ON-OFF control. The switch elements SWCak and SWCbk are each composed of, for example, an N-channel FET.

Next, a configuration of the memory cell MRk in the above-described configuration will be described with reference to FIG. 6.

Figure 6A:
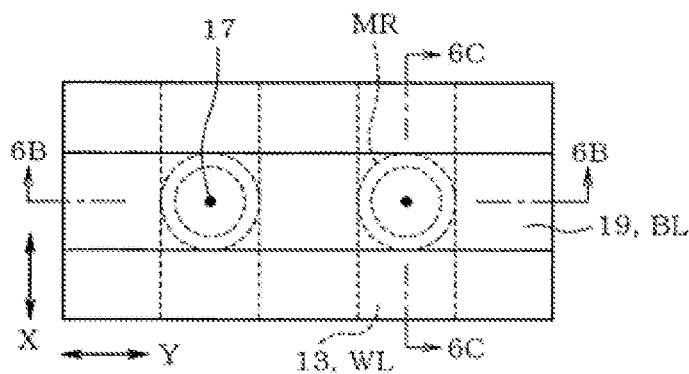
FIG. 6A is a schematic plan view illustrating an example of memory cells MR.
Figure 6B:
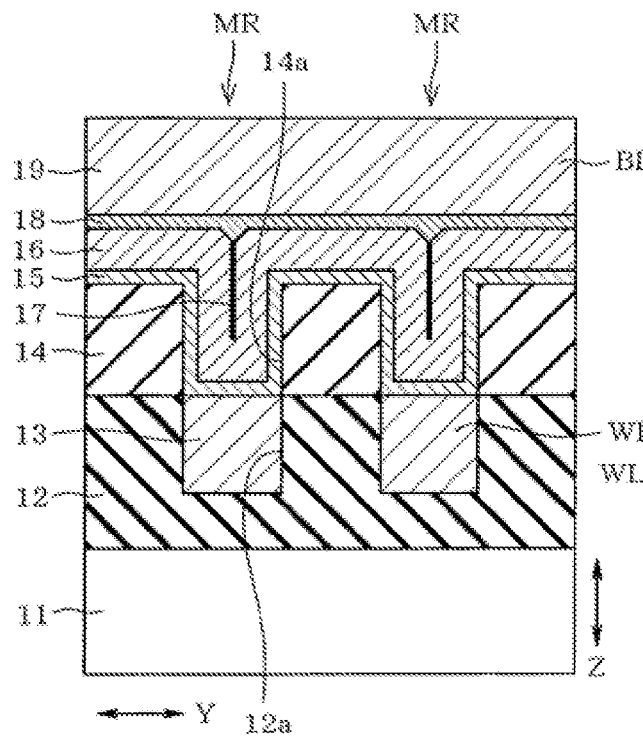
FIG. 6B is a longitudinal sectional view illustrating an example of a portion shown by the line 6B-6B of FIG. 6A.
Figure 6C:
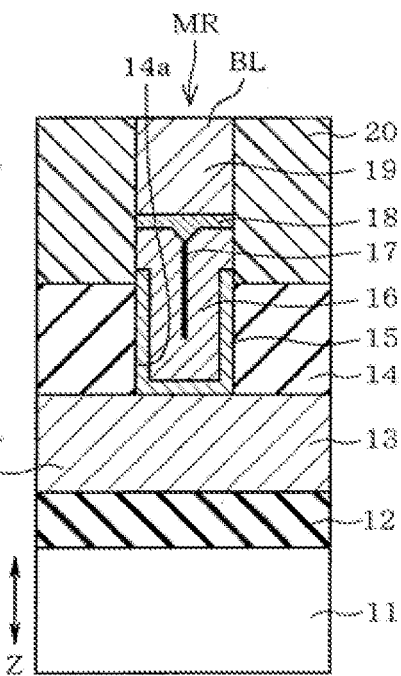
FIG. 6C is a longitudinal sectional view illustrating an example of a portion shown by the line 6C-6C of FIG. 6A.

FIGS. 6A to 6C illustrate the configuration of a memory cell MR which is a structural element of each memory cell layer MM. FIG. 6A is a schematic plan view illustrating an example of two adjacent memory cells MR. FIG. 6B is a longitudinal sectional view illustrating an example of a portion of FIG. 6A cut by the line 6B-6B, and FIG. 6C is a longitudinal sectional view illustrating the portion of FIG. 6A cut by the line 6C-6C.

In FIGS. 6A to 6C, the memory cells MR are disposed at intersection points between two word lines WL which are first wiring lines and one bit line BL which is a second wiring line, respectively. The memory cells MR are also similarly disposed between crossing points of the other word lines WL and bit lines BL. As illustrated in FIGS. 6B and 6C, an insulating film 12 is disposed on a silicon substrate 11. For example, a silicon oxide film may be used as the insulating film 12. Grooves 12a extending in the X-direction are provided in the insulating film 12 at predetermined intervals in the Y-direction, and a lower wiring layer 13 forming the word line WL is embedded in the groove 12a. For example, a high melting point metal such as tungsten (W) may be used as the lower wiring layer 13. An interlayer insulating film 14 covers the upper surfaces of the insulating film 12 and the lower wiring layers 13. For example, a silicon oxide film ($SiO_2$) or the like may be used as the interlayer insulating film 14.

The interlayer insulating film 14 is provided with spaced cylindrical recessed portions 14a in regions of the memory cells MR located above the lower wiring layers 13. A bottom surface of the recessed portion 14a comes into contact with a surface of the lower wiring layer 13. A variable resistance film 15 forming a variable resistance layer is provided to cover side wall surfaces and bottom surfaces in the recessed portions 14a of the interlayer insulating film 14, and to cover region in the Y-direction, between the recessed portions 14a, on the upper surface of the interlayer insulating film 14. For example, a silicon oxide film ($SiO_x$) may be used as the variable resistance film 15. The variable resistance film 15 is formed in a region corresponding to the location of the bit line BL when viewed from above, i.e., it extends below and in the same direction as, the bit line BL.

A metal diffusion film 16 is provided on an upper surface of the variable resistance film 15. The metal diffusion film 16 configures the variable resistance layer together with the variable resistance film 15. The metal diffusion film 16 is embedded in the recessed portions 14a and has seams 17 extending in the Z-direction at substantially the center position of the recessed portions 14a in the X-Y plane. For example, a silicon oxide film ($SiO_x$) different from the silicon oxide film used as the variable resistance film 15 may be used as the metal diffusion film 16. The seam 17 is formed during the formation of the metal diffusion film 16 due to the contact in the central portion between the films growing from the side wall surface toward the center in the cylindrical recessed portion 14a. An upper surface portion of the seam 17 is exposed at an upper surface of the metal diffusion film 16. Here, the seam 17 is formed to have a dot shape in the X-Y plane, and linearly extends in the Z-direction as a contact portion where the metal diffusion film layer growing from the side wall surfaces of the cylindrical recessed portions 14a come into contact with each other. The portion where the seam 17 is formed in the metal diffusion film 16 is a region which has a lower density and a weaker chemical bond to adjacent atoms in the metal diffusion film 16 than in other regions of the metal diffusion film 16.

A metal supply layer 18 is provided on the upper surface of the metal diffusion film 16. For example, a silver (Ag) film or the like may be used as the metal supply layer 18. An upper wiring layer 19 to be patterned as a bit line BL is provided on an upper surface of the metal supply layer 18. For example, a high melting point metal such as tungsten (W) may be used as the upper wiring layer 19. The upper wiring layer 19 becomes the bit line BL and is processed to have a line shape extending in the Y-direction together with the metal supply layer 18 and the metal diffusion film 16. An insulating film 20 is provided on both side portions of the patterned upper wiring layer 19, the metal supply layer 18, and the metal diffusion film 16 processed to have a line shape. The bit line BL is embedded in the insulating film 20. For example, a silicon oxide film or the like may be used as the insulating film 20.

An action of the memory cell MR having the above-described configuration will be described.

As described above, since the portion where the seam 17 is formed in the metal diffusion film 16 is a region which has a lower density and a weaker chemical bond than other regions (for example, the portion of the metal diffusion film 16 excluding the seam 17), silver (Ag) which is diffused from the metal supply layer 18 may be easily and selectively diffused to the region of the seam 17. Accordingly, when a potential difference is applied between the lower wiring layer 13 and the upper wiring layer 19, the metal of the metal supply layer 18 moves under the influence of an electric field from the metal supply layer 18 into the seam 17 of the metal diffusion film 16.

The metal is easily diffused under the influence electric field in the region of the seam 17 of the metal diffusion film 16, and thus a conductive filament is formed in the seam 17. Furthermore, since the insulating film forming the metal diffusion film 16 is formed to have a low density, the conductive filament extends into the metal diffusion film 16 from the tip or end portion of the seam 17 within the metal diffusion film 16 and reaches up to the vicinity of an interface between the metal diffusion film 16 and the variable resistance film 15. Since the insulating film forming the variable resistance film 15 is formed to have a high density, the growth of the conductive filament into the variable resistance film 15 is suppressed, and thus a conductive filament having a stable path from the metal supply layer 18 to the interface between the variable resistance film 15 and the metal diffusion film 16 is formed.

Thereafter, a potential difference of the same polarity is applied between the lower wiring layer 13 and the upper wiring layer 19. As described above, since the seam 17 is formed to have a dot shape in the X-Y plane, the electric field is concentrated at the tip end portion of the conductive filament formed in the seam 17. As a result, the metal is easily diffused, under the influence of the electric field, from the filament to the variable resistance film 15. Accordingly, a conductive bridge penetrating from the upper wiring layer 19 configuring the bit line BL to the lower wiring layer 13 configuring the word line WL is formed, and an ON-state in which the resistance between the lower wiring layer 13 and the upper wiring layer 19 is low is provided.

In contrast, when a potential difference of a polarity opposite to the above-described case is applied between the word line WL (the lower wiring layer 13) and the bit line BL (the upper wiring layer 19), the metal diffused into the metal diffusion film 16 easily moves to the tip end portion of the seam 17 by the influence of the electric field. Accordingly, the previously formed conductive bridge is interrupted by the variable resistance film 15, and an OFF-state in which the resistance is high is provided between the lower wiring layer 13 and the upper wiring layer 19. Therefore, a low-voltage and low-current switching operation may be achieved by providing the seam 17 in the metal diffusion film 16, and a metal supply layer at least at the seam 17.

When the variable resistance film 15 is thinner than the insulating film of the metal diffusion film 16, a metal diffusion distance for forming an ON-state or an OFF-state in the variable resistance film 15 is reduced, and thus a low-current, low-voltage, and short-time switching operation may be performed, and a rewriting operation may be repeatedly performed many times.

In addition, in the above-described configuration, since silver which is a diffusion metal is selectively diffused and moved to the regions of the linear seams 17 provided one by one in the respective memory cells MR, variations in the switching characteristics between the elements may be remarkably reduced, as compared to the related art in which a conductive bridge is randomly formed.

In this embodiment, the region where the seam 17 is formed is provided to come into direct contact with the metal supply layer 18. Furthermore, the seam 17 extends in a direction toward the word line WL (Z-direction) when viewed from the metal supply layer 18. Accordingly, diffusion of silver into the region of the seam 17 under the electric field, and diffusion in the direction of the word line WL (Z-direction) from the tip of the seam 17, readily occurs under the influence of the electric field.

In this embodiment, the seam 17 is provided linearly in the metal diffusion film 16, but is not limited thereto. The seam 17 may be provided to have a planar shape. As in the case of the linear seam 17, a low-voltage or low-current switching operation may be resultingly performed.

In addition, in this embodiment, an individual seams 17 in the metal diffusion film 16 is provided in each memory cell MR. However, more than one seam may be provided in each memory cell MR, and even when two or more seams are provided, a low-voltage or low-current switching operation may be performed. In this case, in order to reduce variations in the switching characteristics between the elements, the same number of seams are provided in each of the respective memory cells MR.

The seam 17 formed in the above-described metal diffusion film 16 has such properties that it is rapidly etched when being dipped in, for example, an etching solution such as a dilute hydrofluoric acid solution. Accordingly, the number of seams provided in each memory cell MR may be easily confirmed.

Figure 8A:
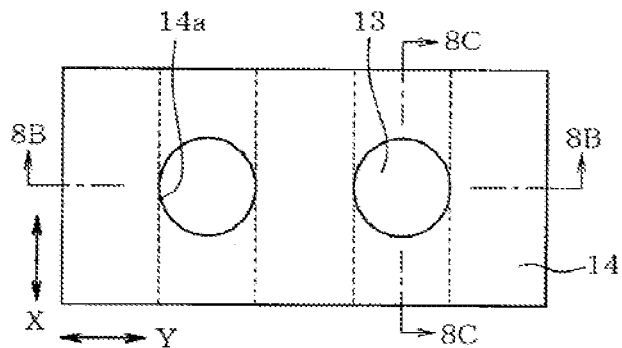
FIG. 8A is a schematic plan view illustrating an example of the memory cells MR in one stage of a manufacturing process.
Figures 8B, 8C:
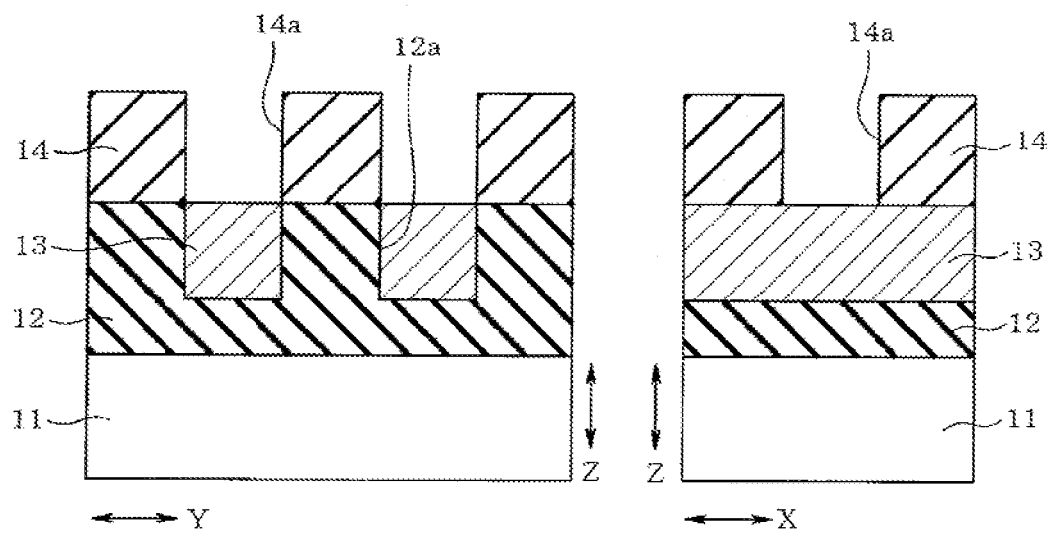
FIG. 8B is a longitudinal sectional view illustrating an example of a portion shown by the line 8B-8B of FIG. 8A in one stage of the manufacturing process.
FIG. 8C is a longitudinal sectional view illustrating an example of a portion shown by the line 8C-8C of FIG. 8A in one stage of the manufacturing process.

Next, a process of manufacturing the memory cell MR having the above-described configuration will be described with reference to FIGS. 7 to 9. In FIGS. 7 to 9, the same parts as those in FIGS. 6A to 6C are illustrated in FIGS. 7A to 9C.

First, as illustrated in FIGS. 7A to 7C, an insulating film 12 such as a silicon oxide film is formed on a silicon substrate 11, and grooves 12a for word lines WL are formed using a lithography technique. A plurality of grooves 12a extending in the X-direction is formed at predetermined intervals (a predetermined spacing) in the Y-direction. Thereafter, for example, as a lower wiring layer 13 to be configured as individual word lines WL, a film made of a high melting point metal such as tungsten (W) is embedded in the grooves 12a. In this case, a tungsten film is formed on the entire upper surface of the insulating film 12, and then planarization is performed using a technique such as a chemical mechanical polishing (CMP) method so that the tungsten film remains in the groove 12a but is removed from the upper surface of the insulating film 12, whereby the lower wiring layer 13 is formed. Other than the formation of the tungsten film as a single layer, the lower wiring layer 13 may also be formed to have a lamination structure formed of two or more types of conductive layers.

Next, an interlayer insulating film 14 such as a silicon oxide film is formed on the upper surfaces of the planarized insulating film 12 and lower wiring layer 13. Thereafter, recessed portions 14a as shown in FIGS. 8A to 8C are formed in the interlayer insulating film 14 using a lithography technique. The recessed portions 14a are formed to have a cylindrical pattern and expose the lower wiring layer 13 therein at a position where the memory cell MR is to be disposed in the interlayer insulating film 14. The recessed portion 14a is formed to have a diameter in a range of, for example, 10 nm to 100 nm. In addition, the recessed portion 14a is formed so that when the lower wiring layer 13 is viewed in the Z-direction from the opening portion, a center line of the cylinder is positioned in the region where the lower wiring 13 is formed, generally at the center of the lower wiring 13.

Figure 9A:
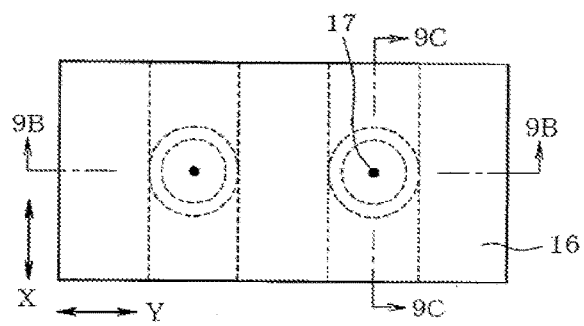
FIG. 9A is a schematic plan view illustrating an example of the memory cells MR in one stage of a manufacturing process.
Figure 9B:
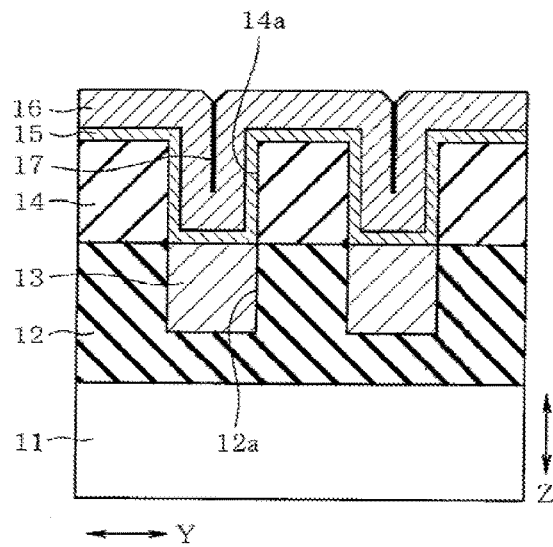
FIG. 9B is a longitudinal sectional view illustrating an example of a portion shown by the line 9B-9B of FIG. 9A in one stage of the manufacturing process.
Figure 9C:
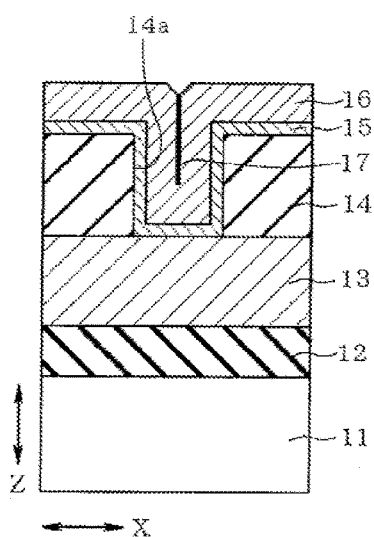
FIG. 9C is a longitudinal sectional view illustrating an example of a portion shown by the line 9C-9C of FIG. 9A in one stage of the manufacturing process.

Referring to FIGS. 9A to 9C, a variable resistance film 15 is formed to cover an upper surface of the interlayer insulating film 14 and internal wall surfaces and internal bottom surfaces of the recessed portions 14a. As the variable resistance film 15, for example, an insulating film such as a silicon oxide ($SiO_x$) is formed using a chemical vapor deposition (CVD) method, an atomic layer deposition (ALD) method or the like. In addition, the variable resistance film 15 is formed to have a desired thickness on the internal walls of the recessed portions 14a so that a cylindrical space having a diameter of several nm to several tens of nm remains in the recessed portion 14a. Other than the silicon oxide, other oxides, silicon nitrides ($SiN_x$), other nitrides, and the like may be used as the variable resistance film 15.

Next, an insulating film to be patterned into the metal diffusion film 16 is formed using a CVD method, an ALD method or the like to be formed on an upper surface of the variable resistance film 15 and to fill the recessed portions 14a. For example, an amorphous insulating film such as silicon oxides ($SiO_x$), other oxides, silicon nitrides ($SiN_x$), and other nitrides may be used as the metal diffusion film 16. At this time, the surfaces of the amorphous insulating film deposited and growing in a direction from the internal wall surface toward the center of the recessed portion 14a are brought into contact with each other in the center line portion of the recessed portions 14a, and a linear seam 17 having a low density and a weak chemical bond is formed in the foregoing contact portion. The linear seam 17 is formed in a substantially central portion of the annular recessed portion 14a when viewed in the Z-direction, and is formed to extend in the Z-direction from the position of the surface of the metal diffusion film 16 toward the lower wiring layer 13 when viewed in the X-direction or the Y-direction.

Next, FIGS. 6A to 6C, the metal supply layer 18 illustrated in FIGS. 6A to 6C is formed on the entire upper surface of the metal diffusion film 16 using a CVD method, an ALD method, a physical vapor deposition (PVD) method, an application method or the like. As the metal supply layer 18, for example, a metal film having a high diffusion coefficient such as silver (Ag), copper (Cu), and nickel (Ni), a film of an alloy thereof, or a film containing the metals may be used. At this time, the metal supply layer 18 is formed to come into direct contact with the metal diffusion film 16 and the seam 17.

Next, a metal film for forming an upper wiring layer 19 is formed on the entire upper surface of the metal supply layer 18. For the upper wiring layer 19, a film made of tungsten which is a high melting point metal or a lamination of a plurality of metal films may be used as in the case of the lower wiring layer 13. Thereafter, the upper wiring layer 19, the metal supply layer 18, the metal diffusion film 16, and the variable resistance film 15 are processed to form a bit line BL. At this time, the bit line formation position is adjusted so that when viewed from above (Z-direction), the seam 17 is present in the region where the bit line BL is formed.

In the above-described manufacturing method, the temperature, pressure, gas flow rate, and the like after the film formation, or the heat process and the like after the formation of the element are adjusted so that a second insulating film to be the metal diffusion film 16 is rendered amorphous. When the second insulating film is a polycrystalline film having grain boundaries, the grain boundaries become metal diffusion paths. Therefore, in order to reduce variations in the switching characteristics between the elements, the second insulating film is desirably amorphous. In addition, the metal diffusion film is not necessarily an insulating film, and may be amorphous silicon or the like. In order to achieve a large-scale memory by suppressing a dark current in the off state, an insulating film is preferably used.

A depression region having an upper opening may be used in place of the recessed portion 14a. An amorphous insulating film to be the metal diffusion film 16 may also be embedded in the internal surface of a pipe-shaped (elongated cylindrical) structure penetrating the interlayer insulating film to form the linear seam 17 extending in the Z-direction inside the pipe-shaped structure, and then a wiring layer to be a word line or a bit line may be formed at both ends of the pipe-shaped structure.

The second insulating film forming the metal diffusion film 16 may obtain favorable switching characteristics when it has a lower film density than a first insulating film to be the variable resistance film 15. In this case, when the first insulating film forming the variable resistance film 15 is formed through thermal CVD film formation or thermal ALD film formation and the second insulating film forming the metal diffusion film 16 is formed through plasma CVD film formation or plasma ALD film formation, a configuration satisfying the above-described film density condition may be obtained.

Second Embodiment

Figure 10A:
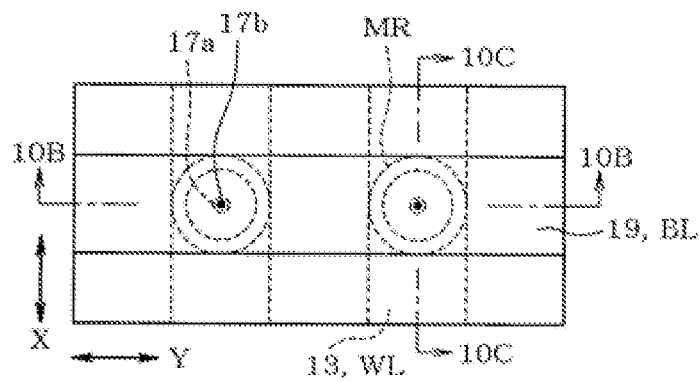
FIG. 10A is a schematic plan view illustrating an example of memory cells MR according to a second embodiment.
Figure 10B:
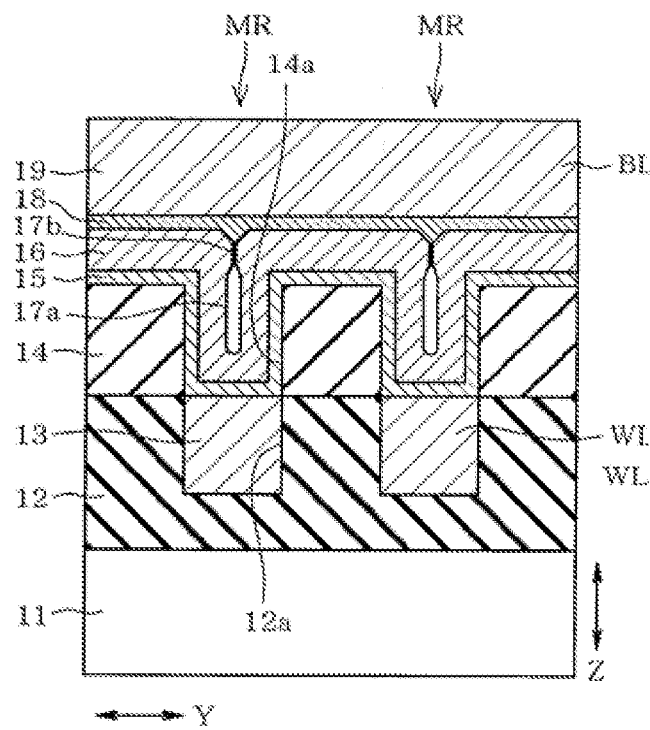
FIG. 10B is a longitudinal sectional view illustrating an example of a portion shown by the line 10B-10B of FIG. 10A.
Figure 10C:
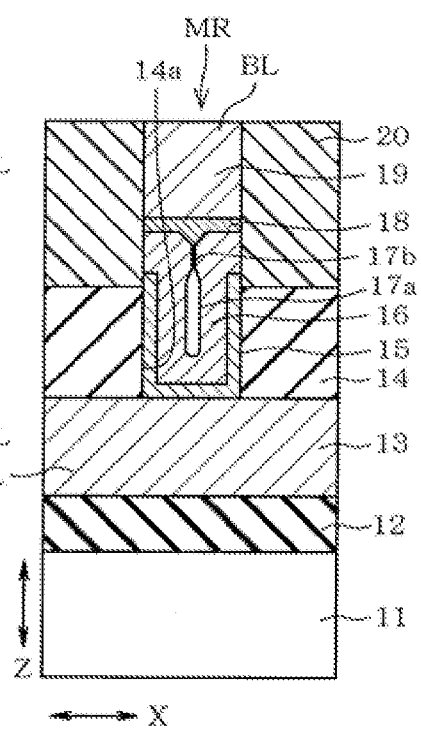
FIG. 10C is a longitudinal sectional view illustrating an example of a portion shown by the line 10C-10C of FIG. 10A.

FIG. 10 illustrates a second embodiment. In this embodiment, a void 17a closed by contact on the upper side is provided in place of the seam 17 of the metal diffusion film 16 shown in the first embodiment.

As in the first embodiment, an insulating film 12 is disposed on a silicon substrate 11, and a lower wiring layer 13 is embedded in grooves 12a formed in the insulating film 12. An interlayer insulating film 14 is disposed on upper surfaces of the insulating film 12 and the lower wiring layer 13, and cylindrical recessed portions 14a are provided in regions where the memory cells MR are formed. A variable resistance film 15 forming a variable resistance layer is provided in a Y-direction to cover the region including the interlayer insulating film 14 and the recessed portions 14a.

A metal diffusion film 16 is provided on an upper surface of the variable resistance film 15. The metal diffusion film 16 forms the variable resistance layer together with the variable resistance film 15. The metal diffusion film 16 is provided to be embedded in the recessed portions 14a and has voids 17a extending in a Z-direction in the recessed portions 14a. During the process in which the metal diffusion film 16 is formed and grows from the side wall surface toward the center in the cylindrical recessed portion 14a, the void 17a is formed due to the contact at a contact point 17b between the films in the vicinity of the upper opening portion of the recessed portion 14a. In the portion where the void 17a is formed in the metal diffusion film 16, metal easily moves due to the void 17a. In addition, the contact point 17b is a region which has a lower density and a weaker chemical bond than other regions (for example, the void 17a and the region of the metal diffusion film 16 excluding the contact point 17b), and metal easily moves therethrough and therein.

A metal supply layer 18 is provided on an upper surface of the metal diffusion film 16, and an upper wiring layer 19 for the bit line BL is provided on an upper surface of the metal supply layer 18. The upper wiring layer 19 becomes the bit line BT and, together with the metal supply layer 18 and the metal diffusion film 16 is processed to have a line shape extending in the Y-direction. An insulating film 20 is provided on both side portions of the upper wiring layer 19, the metal supply layer 18, and the metal diffusion film 16 is processed to have a line shape. Accordingly, the bit line BL is embedded in the insulating film 20.

As in the above-described configuration, the portion where the contact point 17*b* is formed is a region which has a lower density and a weaker chemical bond than other regions. Thus, silver (Ag) as a metal which is diffused by the metal supply layer 18 may be easily and selectively diffused to the contact point 17*b* of the metal supply layer 18 and the surface layer region facing the void 17*a*. Accordingly, when a potential difference is given between the lower wiring layer 13 and the upper wiring layer 19, the metal moves under the influence of an electric field from the metal supply layer 18 to the metal diffusion film 16.

The metal is easily diffused under the influence of the electric field in the surface layer region facing the void 17*a* in the metal diffusion film. 16, and thus a conductive filament is formed. Furthermore, since the insulating film forming the metal diffusion film 16 is formed to have a low density, the conductive filament further extends in the metal diffusion film 16 from a tip end portion of the void 17*a* and reaches up to the vicinity of an interface between the metal diffusion film 16 and the variable resistance film 15. Since the insulating film configuring the variable resistance film 15 is formed to have a high density, the growth of the conductive filament is suppressed therein, and thus a conductive filament having a stable path from the metal supply layer 18 to the interface between the variable resistance film 15 and the metal diffusion film 16 is formed.

Accordingly, as in the first embodiment, a conductive bridge penetrating from the upper wiring layer 19 configuring the bit line BL to the lower wiring layer 13 configuring the word line WL may be formed, and an ON-state in which the resistance between the lower wiring layer 13 and the upper wiring layer 19 is low may be provided. In addition, when a potential difference of a polarity opposite to the above-described case is given between the word line WL (the lower wiring layer 13) and the bit line BL (the upper wiring layer 19), an OFF-state in which the resistance is high therebetween may be provided. Accordingly, a low-voltage and low-current switching operation may be achieved by providing the void 17*a* in the metal diffusion film 16. In this embodiment, since the metal is diffused using the void, a lower-voltage and lower-current switching operation may be performed than the first embodiment using the seam.

In this embodiment, the void 17*a* closed by the contact point 17*b* is provided as one portion in the metal diffusion film 16 in the recessed portion 14*a*. However, the void is not limited thereto. The void may be provided to have a plurality of contact points. Accordingly, a low-voltage or low-current switching operation may be performed similarly.

The void 17*a* formed in the above-described metal diffusion film 16 has such properties that it is rapidly etched when being dipped in, for example, an etching solution such as a dilute hydrofluoric acid solution. Accordingly, the existence of the seams 17 may be easily confirmed.

Third Embodiment

FIGS. 11 to 20 illustrate a third embodiment. In this embodiment, a prismatic memory cell MRs is provided in place of the cylindrical memory cell MR according to the first embodiment.

Figure 11:
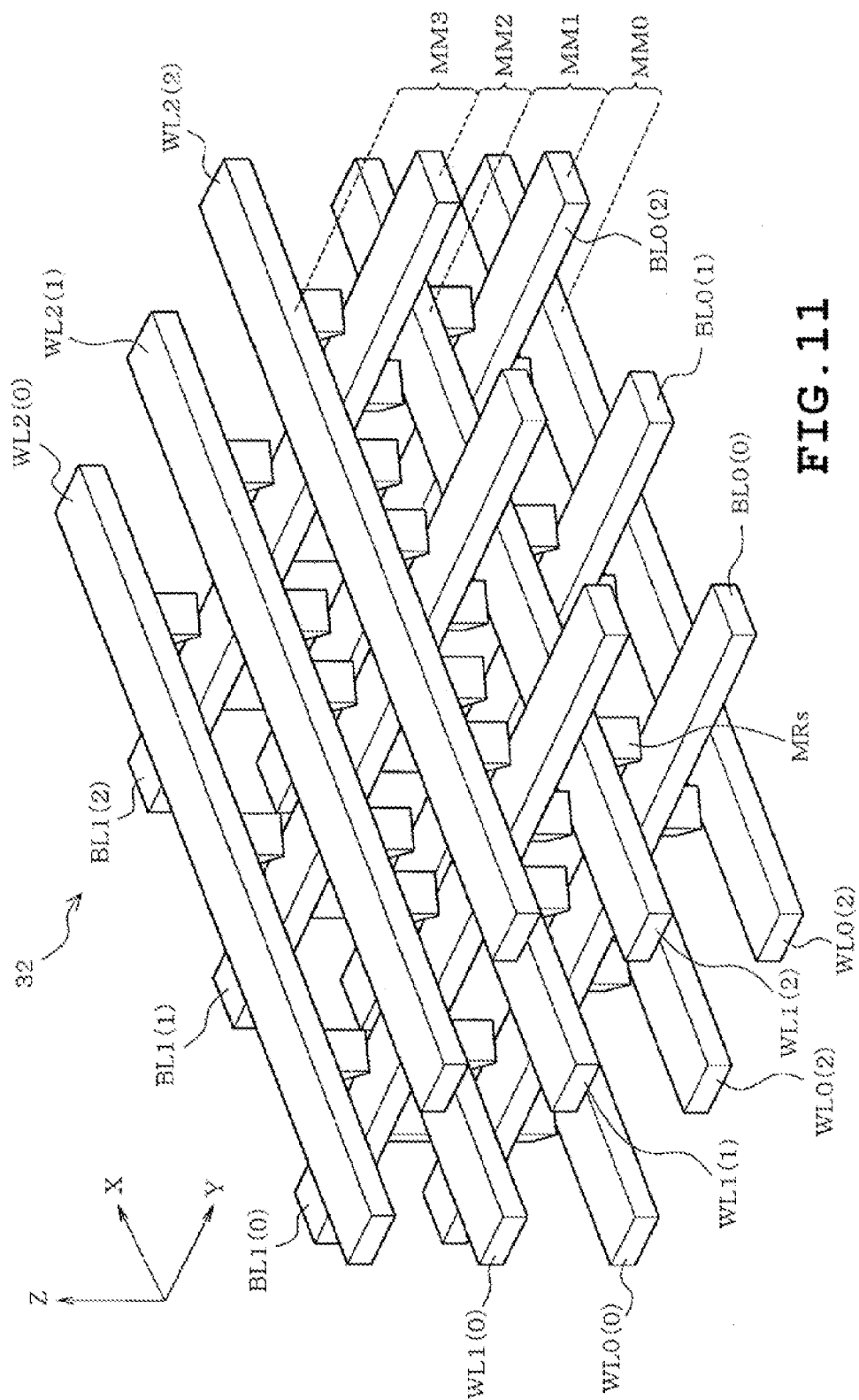
FIG. 11 is a schematic diagram illustrating an example of a configuration of a portion of a memory cell portion according to a third embodiment.

FIG. 11 is a schematic perspective diagram illustrating an example of an electrical structure of a memory cell array 32 of a conductive bridging RAM 31 according to the second embodiment. The memory cell array 32 has substantially the same configuration as the memory cell array 2 according to the first embodiment, and has a cross-point structure. Each of memory cell layers MM0 to MM3 is provided with a plurality of memory cells MRs disposed in an array or matrix in a X-direction and in a Y-direction.

Figure 12:
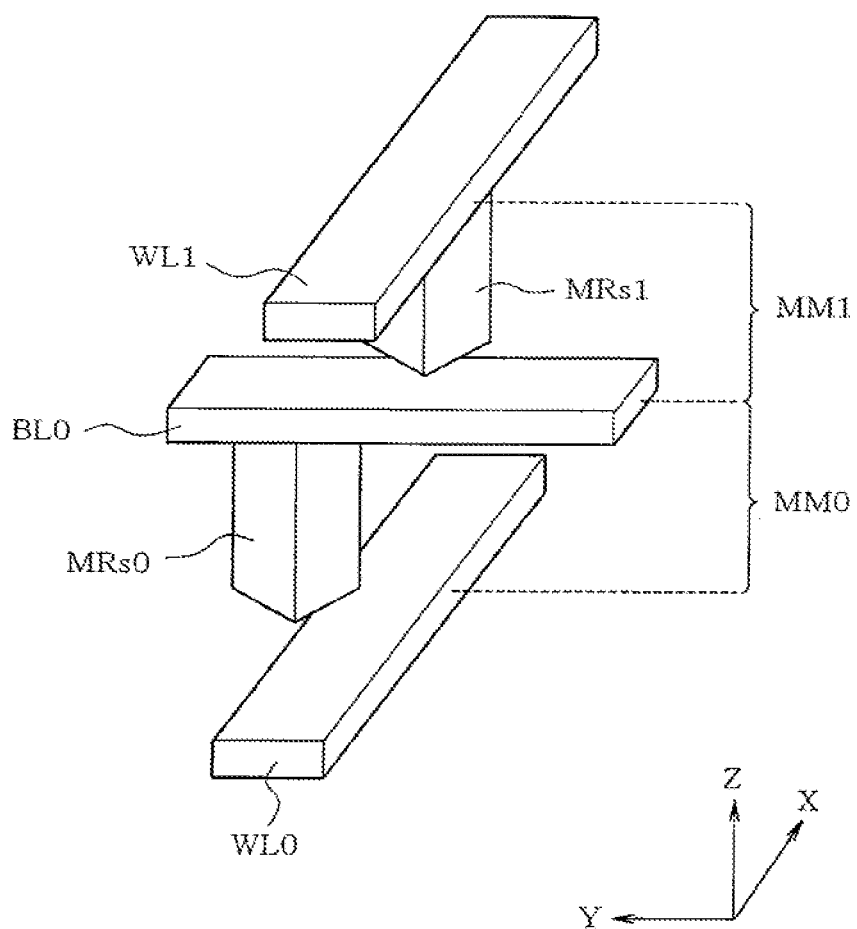
FIG. 12 is a diagram illustrating an example of a configuration of a memory cell.

FIG. 12 illustrates an example of wiring lines for the memory cell layers MM in the crossing-point conductive bridging RAM. 31 and of a basic configuration of an electrical structure of the memory cell MRs. Here, memory cells MRs0 and MRs1 in the two memory cell mats MM0 and MM1 in FIG. 10 are illustrated.

The memory cell MRs0 is provided at a crossing location of a word line WL0 and a bit line BL0, and the memory cell MRs1 is provided at a crossing location of the bit line BL0 and a word line WL1. Similarly, each of memory cells MRs2 and MRs3 of the upper memory cell layers MM is disposed at a portion where a word line WL crosses a bit line BL. In addition, as for each of these memory cells MRs0 to MRs3, a corresponding memory cell MRs may be selected by selecting a word line WL or a bit line BL which is disposed to be opposed to the bit line BL or the word line WL.

In addition, in FIG. 12, the memory cells MRs0 and MRs1, having a quadrangular prism shape which is a polygonal shape, are disposed so that the two diagonal directions across the cell substantially coincide with the X-direction and the Y-direction, and a central portion of the quadrangular prism is positioned to slightly deviate, i.e., is offset from, the portion where the word line WL intersects the bit line BL.

Figure 13A:
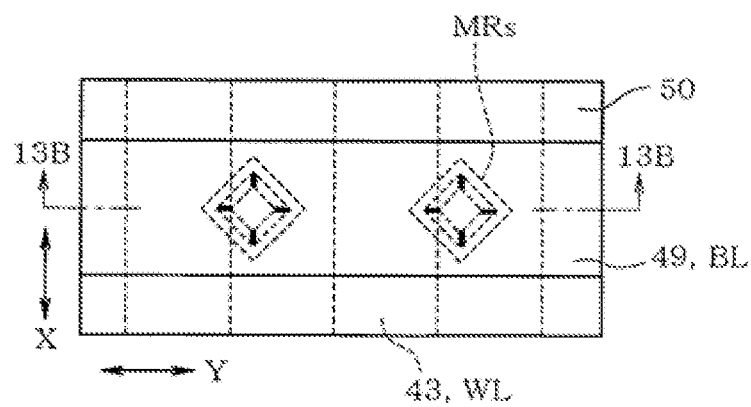
FIG. 13A is a schematic plan view illustrating an example of memory cells MR.
Figure 13B:
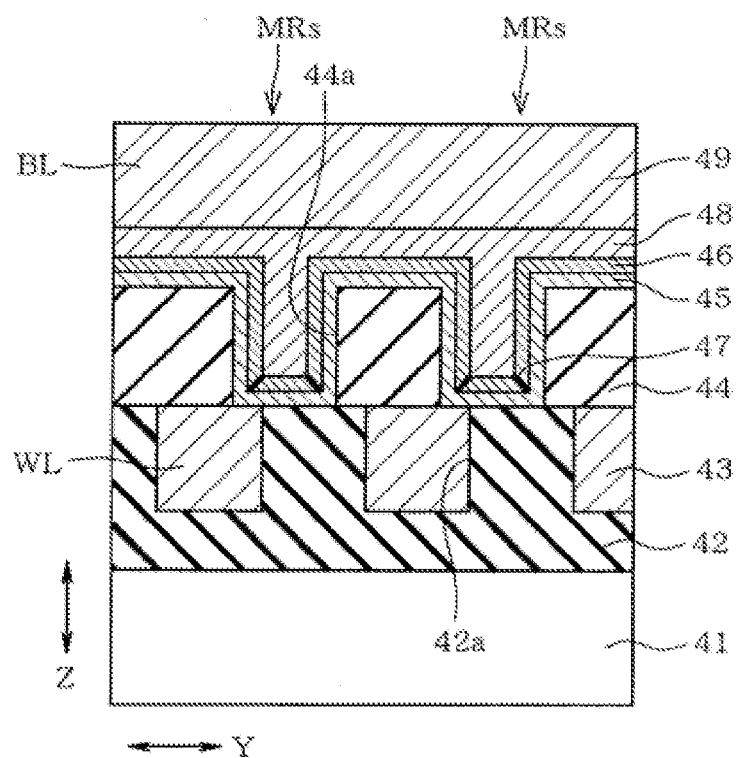
FIG. 13B is a longitudinal sectional view illustrating an example of a portion shown by the line 13B-13B of FIG. 13A.
Figure 14:
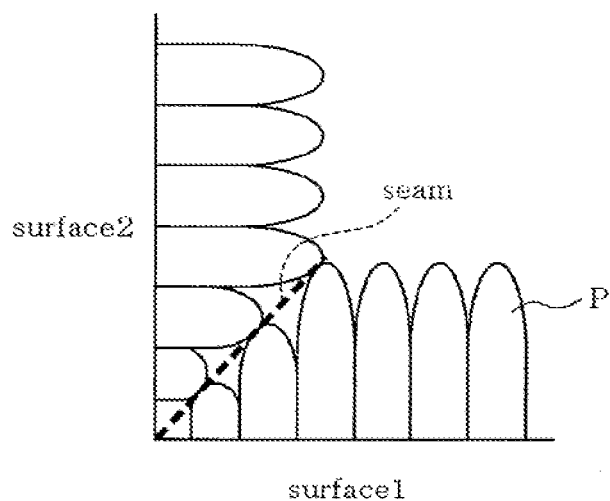
FIG. 14 is a diagram illustrating an example of a seam formation principle.

Next, a configuration of the memory cell MRs in the above-described configuration will be described with reference to FIG. 13. FIGS. 13A and 13B illustrate the configuration of a memory cell MR which is a structural element of each memory cell layer MM. FIG. 13A is a schematic plan view illustrating an example of two memory cells MRs. FIG. 13B is a longitudinal sectional view illustrating an example of a portion shown by the line 13B-13B of FIG. 13A.

In FIGS. 13A and 13B, the memory cells MRs are disposed at crossing locations of three word lines WL and a bit line BL crossing perpendicular thereto, respectively. As illustrated in FIG. 13B, an insulating film 42 is disposed on a silicon substrate 41. For example, a silicon oxide film or the like may be used as the insulating film 42. Grooves 42*a* extending in the X-direction are provided in the insulating film 42 at predetermined intervals in the Y-direction, and a lower wiring layer 43 configuring the word line WL is embedded in the groove 42*a*. For example, a high melting point metal such as tungsten (W) may be used as the lower wiring layer 43. An interlayer insulating film 44 is disposed to cover upper surfaces of the insulating film 42 and the lower wiring layers 43. For example, a silicon oxide film may be used as the interlayer insulating film 44.

The interlayer insulating film 44 is provided with columnar recessed portions 44*a* having at least one corner in regions of the memory cells MR above the lower wiring layers 43. The recessed portion 44*a* is disposed so that diagonal directions of the recessed portion 44*a*, for example, across opposed corners of the recessed portion 44*a*, extend in the X-direction and the Y-direction, and is positioned to deviate, or be offset, from the center of the upper surface portion of the lower wiring layer 43. The recessed portion 44*a* is disposed so that one corner thereof is positioned above the lower wiring layers 43. A variable resistance film 45 as a variable resistance layer is provided to cover side wall surfaces and bottom surfaces in the recessed portions 44a of the interlayer insulating film 44, and to cover a region in the Y-direction including the recessed portions 44a of the upper surface of the interlayer insulating film 44. For example, a silicon oxide film ($SiO_x$) may be used as the variable resistance film 45. The region where the variable resistance film 45 is formed is a region corresponding to the bit line BL.

A metal diffusion film 46 forming the variable resistance layer is provided on an upper surface of the variable resistance film 45. The metal diffusion film 46 is conformally formed along the internal wall surface of the recessed portion 44a. Seams 47 are formed to be oriented to the X-, Y-, and Z-directions in portions where the bottom surface portion and the side wall surface of the metal diffusion film 46 in the recessed portion 44a come into contact with each other from the three directions. Here, when the recessed portion 44a has a quadrangular prism shape, four corners are formed, and thus a seam 47 is formed at four positions in the metal diffusion film 46. Here, when four seams 47 are formed, these are disposed so that one seam 47 is positioned over the upper surface of the lower wiring layer 43 and the remaining three seams 47 are positioned over the insulating film 42. For example, a polycrystalline silicon film may be used as the metal diffusion film 46.

Specifically, in this embodiment, the seam. 47 is a grain boundary region where columnar crystal grains may collide with each other. For example, in the schematic diagram illustrated in FIG. 14, when a columnar polycrystalline film P such as polycrystalline silicon is grown from a first surface (surface 1) and from a second surface (surface 2), the region, shown by the broken line, where the collision occurs becomes a seam 47 which has a lower density and a weaker chemical bond than grain boundaries between columnar polycrystalline grains in the same direction. In this embodiment, a linear seam 47 is formed through crystal growth from three surfaces, i.e., the bottom surface and the two side wall surfaces, perpendicular thereto, of the recessed portion 44a.

A metal supply layer 48 is provided on the upper surface of the metal diffusion film 46. The metal supply layer 48 is also formed on the surface of the metal diffusion film 46 in the recessed portion 44a to fill the recessed portion 44a. For example, a silver (Ag) film or the like may be used as the metal supply layer 48. An upper wiring layer 49 to form the bit line BL is provided on an upper surface of the metal supply layer 48. For example, a high melting point metal such as tungsten (W) may be used as the upper wiring layer 49. The upper wiring layer 49 becomes the bit line BL and is processed, together with the metal supply layer 48 and the metal diffusion film 46, to have a line shape extending in the Y-direction. An insulating film 50 is provided on both side portions of the upper wiring layer 49, the metal supply layer 48, and the metal diffusion film 46 processed to have a line shape. Accordingly, the bit line BL is embedded in the insulating film 50. For example, a silicon oxide film may be used as the insulating film 50.

According to the above-described configuration, the seams 47 formed in the metal diffusion film 46 are regions which has a lower density and a weaker chemical bond than other regions in the metal diffusion film 46 (for example, in the metal diffusion film 46 excluding the seams 47). Accordingly, the silver (Ag) of the metal supply layer 48, which is a diffusion metal, may be easily and selectively diffused to the seam 47.

Accordingly, when a potential difference is applied between the word line WL (lower wiring layer 43) and the bit line BL (upper wiring layer 49), the silver which is a diffusion metal may be easily diffused and moved into the seams 47 in the metal diffusion film 46, and thus a low-voltage or low-current switching operation may be performed. Furthermore, since the silver which is a diffusion metal is selectively diffused to the linear seams 47 provided one by one in the respective memory cells MRs, variations in the switching characteristics between the elements may be drastically reduced, compared to a case in which the conductive bridge is randomly formed.

In this embodiment, the seam 47 comes into direct contact with the metal supply layer 48 and the variable resistance film 45. Furthermore, the linear seam 47 extends in the direction of the word line WL positioned in the Z-direction when viewed from the metal supply layer 48. Accordingly, diffusion of metal to the seam 47 under the electric field, and diffusion in the direction of the word line WL in the seam 47 under the electric field easily occur.

In this embodiment, the seam 47 is linearly formed, but is not limited thereto. It may also be formed to have a planar shape, and in this case, a low-voltage or low-current switching operation may also be performed. However, the effect of sufficiently reducing variations in the switching characteristics between the elements is more favorable when the seam 47 is linearly formed.

In addition, in this embodiment, the seam 47 is provided as a contact portion, but may also be formed to have a void shape as shown in the second embodiment.

Figure 15A:
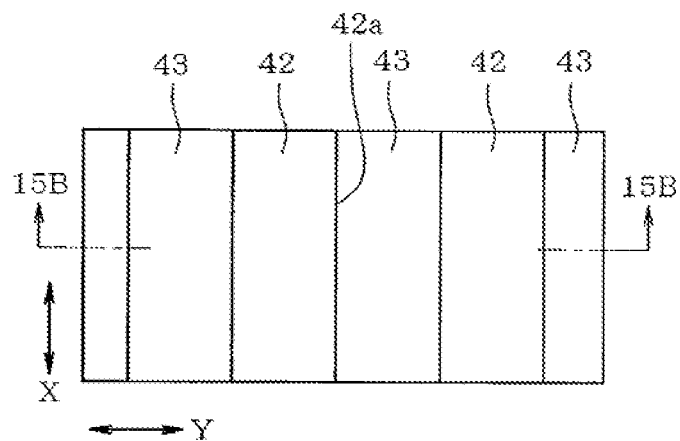
FIG. 15A is a schematic plan view illustrating an example of the memory cells MR in one stage of a manufacturing process.

Next, a process of manufacturing the memory cell MRs having the above-described configuration will be described with reference to FIGS. 15 to 17. In FIGS. 15 to 17, the same parts as those in FIGS. 13A and 13B are illustrated in FIGS. 15A to 17B.

Figure 15B:
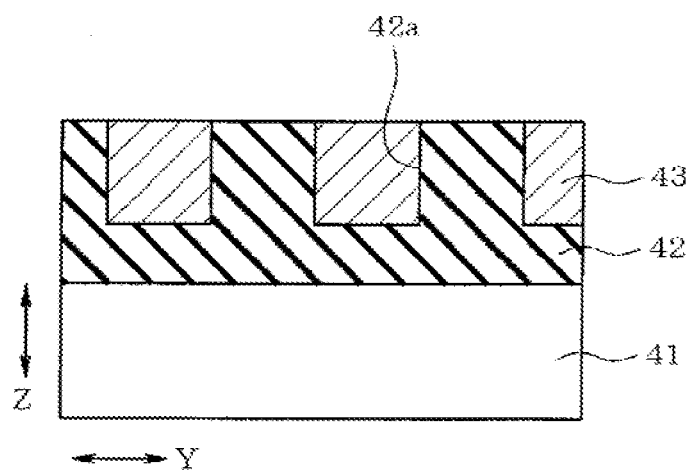
FIG. 15B is a longitudinal sectional view illustrating an example of a portion shown by the line 15B-15B of FIG. 15A in one stage of the manufacturing process.
Figure 16A:
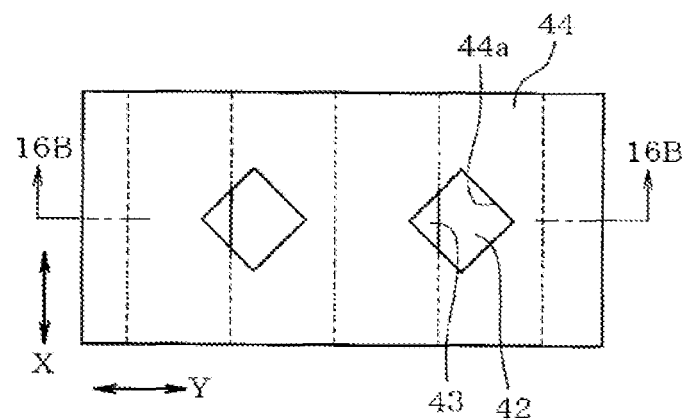
FIG. 16A is a schematic plan view illustrating an example of the memory cells MR in one stage of the manufacturing process.
Figure 16B:
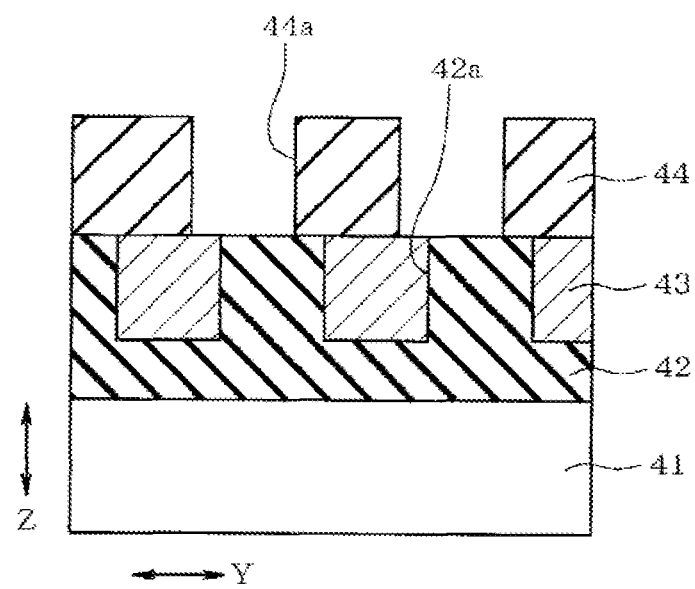
FIG. 16B is a longitudinal sectional view illustrating an example of a portion shown by the line 16B-16B of FIG. 16A in one stage of the manufacturing process.

First, as illustrated in FIGS. 15A and 15B, an insulating film 42 such as a silicon oxide film is formed on a silicon substrate 41, and grooves 42a for word lines WL are formed therein using a lithography technique. A plurality of grooves 42a extending in the X-direction is formed at predetermined intervals in the Y-direction. Thereafter, for example, as a lower wiring layer 43 to form the word lines WL, a film made of a high melting point metal such as tungsten (W) is formed to be embedded in the groove 42a. Other than the formation of the tungsten film as a single layer, the lower wiring layer 43 may also be formed to have a lamination structure formed of two or more types of conductive layers.

Next, an interlayer insulating film 44 such as a silicon oxide film is formed on the upper surfaces of the planarized insulating film 42 and lower wiring layer 43. Thereafter, recessed portions 44a are formed in the interlayer insulating film 44 using a lithography technique as illustrated in FIGS. 16A and 16B. The recessed portions 44a are formed to have a rectangular or diamond-shaped cross-section, and are disposed so that diagonal directions between opposed corners thereof are aligned in the X-direction and the Y-direction. In addition, the recessed portions 44a are provided so that one side thereof is set to substantially 10 nm to 100 nm and one corner is located on the lower wiring layer 43.

Figure 17A:
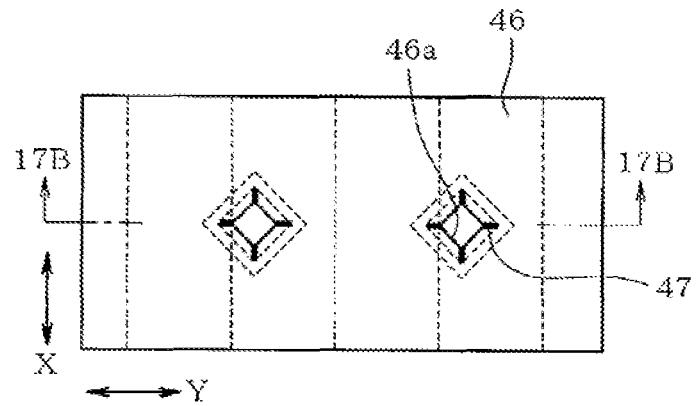
FIG. 17A is a schematic plan view illustrating an example of the memory cells MR in one stage of the manufacturing process.
Figure 17B:
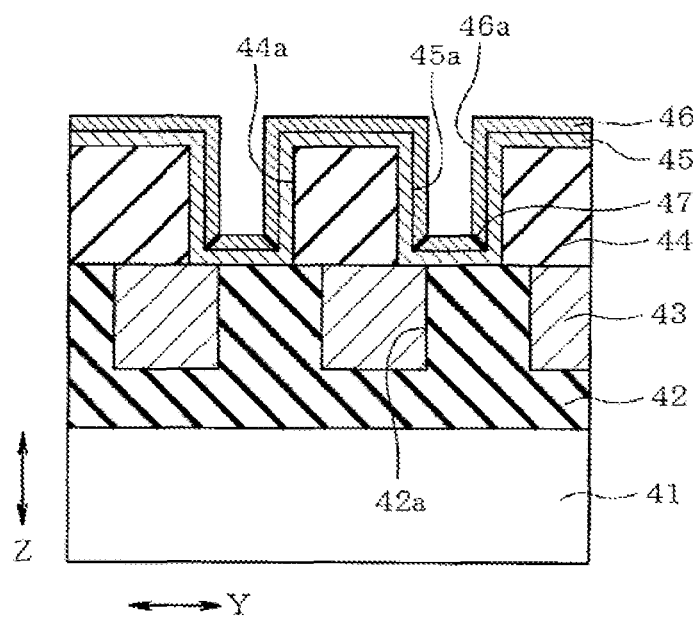
FIG. 17B is a longitudinal sectional view illustrating an example of a portion shown by the line 17B-17B of FIG. 17A in one stage of the manufacturing process.

Next, a variable resistance film 45 is formed to cover an upper surface of the interlayer insulating film 44 and internal wall surfaces and internal bottom surfaces of the recessed portions 44a, as illustrated in FIGS. 17A and 17B. As the variable resistance film. 45, for example, an insulating film such as a silicon oxide ($SiO_x$) is formed using a CVD method, an ALD method or the like. In addition, the variable resistance film 45 is formed to have a desired thickness on the internal walls of the recessed portions 44a so that a cylindrical space having a diameter of several nm to several tens of nm remains in the recessed portion 44a. Other than the silicon oxide, other oxides, silicon nitrides ($SiN_x$), other nitrides, and the like may be used as the variable resistance film 45.

Next, a metal diffusion film 46 having a predetermined thickness, which is a columnar polycrystalline film, is formed to be formed on an upper surface of the variable resistance film 45 and to cover the surface of the variable resistance film 45 in the recessed portion 44a. For example, a silicon film, a titanium nitride film or the like to be a columnar polycrystalline film may be used as the metal diffusion film 46, and the metal diffusion film 46 is formed using a CVD method, an ALD method or the like. At this time, a columnar polycrystalline film is grown from total three surfaces, i.e., the bottom surface and the two side wall surfaces, perpendicular thereto, of the recessed portion 44a, and thus a linear seam 47 having a low density and a weak chemical bond is formed at the position where the surfaces are brought into contact with each other.

The linear seam 47 is formed at the four corners of the recessed portion 44a having a diamond or rectangular shape when viewed in the Z-direction, and it extends from the position of the surface of the metal diffusion film 46 to the variable resistance film 45 when viewed in the X-direction or the Y-direction. The total thickness of the variable resistance film 45 and the metal diffusion film 46 may be appropriately adjusted in such a range that the diamond-shaped recessed portion 44a is not completely filled. Accordingly, the recessed portion 44a has a recessed portion in a state in which the metal diffusion film 46 is formed therein.

Next, a metal supply layer 48 is formed on the entire upper surface of the metal diffusion film 46 using a CVD method, an ALD method, a physical vapor deposition (PVD) method, an application method or the like, as illustrated in FIGS. 13A and 13B. The metal supply layer 48 is also formed to fill the recessed portion 44a. As the metal supply layer 48, for example, a metal film having a high diffusion coefficient such as silver (Ag), copper (Cu), and nickel (Ni), a film of an alloy thereof, or a film containing the metals may be used. At this time, the metal supply layer 48 is formed to come into direct contact with the region of the linear seam 47 of the metal diffusion film 46.

Next, a metal film for forming an upper wiring layer 49 is formed on the entire upper surface of the metal supply layer 48. For the upper wiring layer 49, a film made of tungsten which is a high melting point metal or a lamination of a plurality of metal films may be used as in the case of the lower wiring layer 43. Thereafter, the upper wiring layer 49, the metal supply layer 48, the metal diffusion film 46, and the variable resistance film 45 are processed to form a bit line BL. At this time, the bit line formation position is adjusted so that when viewed from above (Z-direction), the seam 47 is present in the region where the bit line BL is formed.

In the above-described manufacturing method, the rectangular or diamond-shaped recessed portion 44a is formed. However, the shape of the recessed portion 44a may be appropriately changed. For example, when the recessed portion 44a is formed to have a rectangular or diamond shape, the diagonal lines on which the seams form may have different lengths.

In the above-described manufacturing method, the temperature, pressure, gas flow rate, and the like for the film formation, or the heat process and the like after the formation of the element are adjusted so that a second insulating film to be the metal diffusion film 46 is made amorphous. When the second insulating film is a polycrystalline film having grain boundaries, the grain boundaries may become metal diffusion paths. Therefore, in order to sufficiently reduce variations in the switching characteristics between the elements, the second insulating film is desirably amorphous. In addition, the metal diffusion film is not necessarily an insulating film, and may be amorphous silicon or the like. In this case, in order to achieve a large-scale memory by suppressing a dark current in the off time, the insulating film is preferably used.

In this embodiment, in the process of forming the seam 47, a columnar polycrystalline film is grown in three different directions to form a linear grain boundary region, but the process is not limited thereto. For example, as in the first embodiment, a recessed portion having a hollow cylindrical structure may be formed and a columnar polycrystalline film may be grown on an internal wall of the recessed portion to form a linear seam penetrating through the hollow cylindrical structure in the central portion. By forming a word line and a bit line on both sides of this configuration, a memory cell may be formed.

Furthermore, the metal diffusion film 46 is not limited to the columnar polycrystalline film. For example, a metal diffusion film composed of a crystalline film may be epitaxially grown in at least three different directions to form a linear seam in a region where the metal diffusion films collide with each other.

In the above-described embodiment, since the seam 47 is a region where columnar polycrystalline films having different crystal orientations collide with each other, their presence may be confirmed through, for example, transmission electron microscope (TEM) observation.

Modification Example of Third Embodiment

FIGS. 18 to 20 illustrate three modification examples of the third embodiment.

Figure 18A:
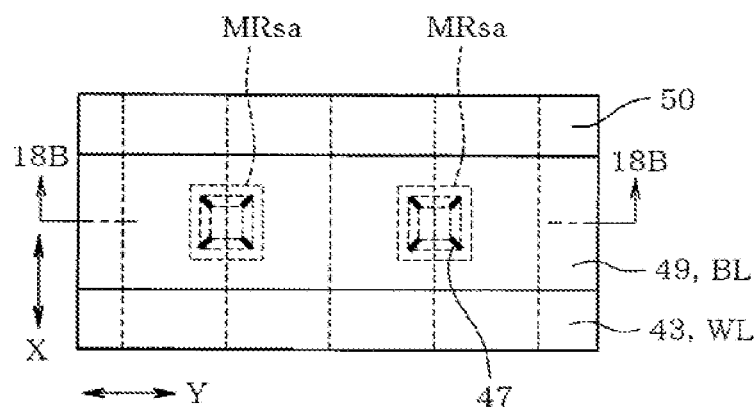
FIG. 18A is a schematic plan view illustrating a modification example of the memory cells MR.
Figure 18B:
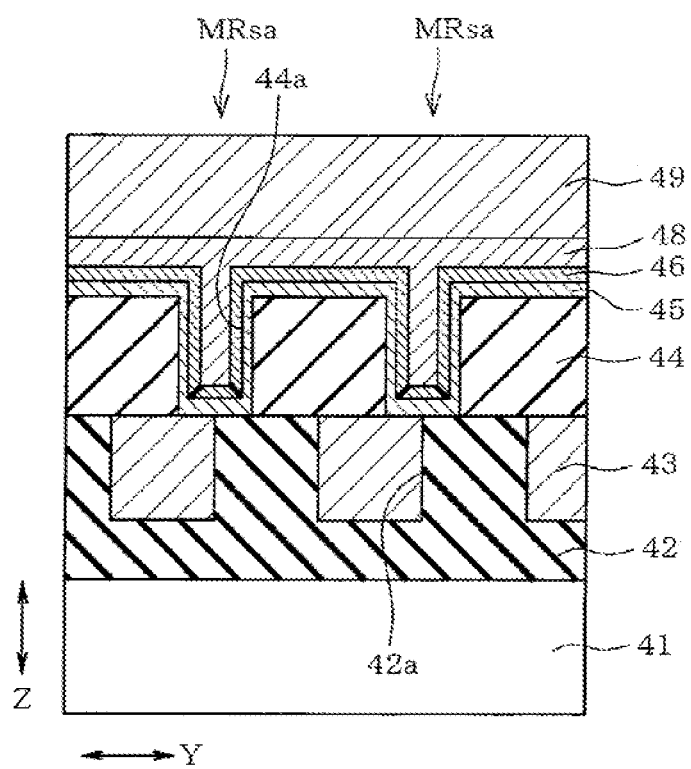
FIG. 18B is a longitudinal sectional view illustrating an example of a portion shown by the line 18B-18B of FIG. 18A.

FIGS. 18A and 18B illustrate a first modification example. In this embodiment, memory cells MRsa are disposed in place of the memory cells MRs. In the above-described embodiment, the memory cells MRs are disposed so that diagonal directions are directed in the directions of the word line WL and the bit line BL, i.e., the X-direction and the Y-direction. However, in this embodiment, the sides of the memory cells MTsa, having the same configuration as those of the previous embodiment, are aligned in the X-direction and the Y-direction.

In addition, by disposing the memory cells as described above, two out of four of the seams 47 formed in the metal diffusion film 46 are disposed to be opposed to, i.e., to overlie, the upper portion of the lower wiring layer 43. Accordingly, in the memory cell MRsa, the two seams 47 contribute to the switching operation when an electric field is applied between the word line WL and the bit line BL.

Figure 19A:
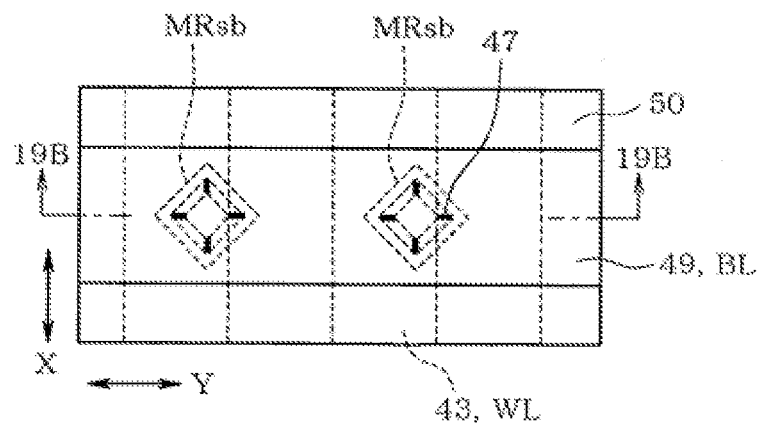
FIG. 19A is a schematic plan view illustrating a different modification example of the memory cells MR.
Figure 19B:
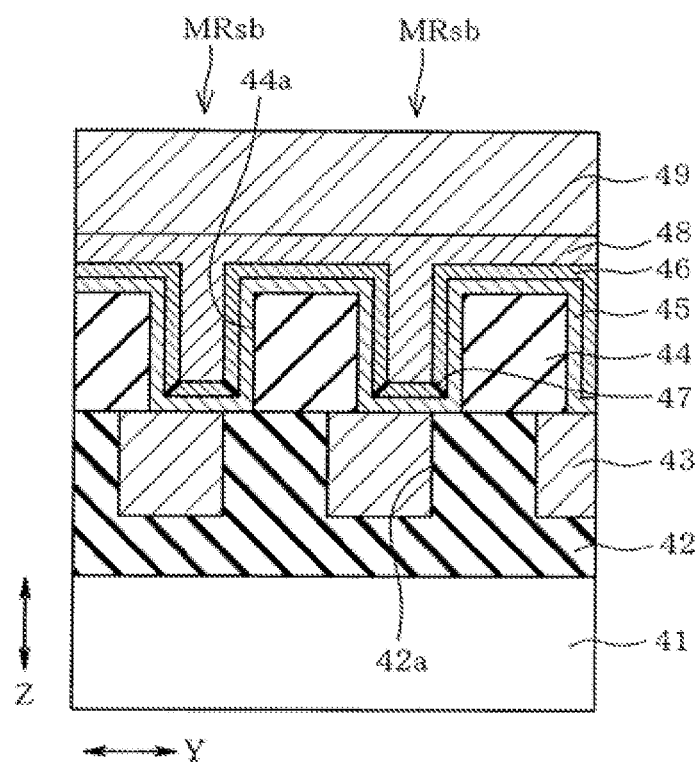
FIG. 19B is a longitudinal sectional view illustrating an example of a portion shown by the line 19B-19B of FIG. 19A.

FIGS. 19A and 19B illustrate a second modification example. In this embodiment, memory cells MRsb are disposed in place of the memory cells MRs. In this embodiment, the memory cells MTsa having the same configuration as the memory cell MRs are deviated in the Y-direction, and three out of four seams 47 formed in the metal diffusion film 46 are disposed to be opposed to, i.e., to overlie, the upper portion of the lower wiring layer 43. Accordingly, in the memory cell MRsb, three of the seams 47 contribute to the switching operation when an electric field is applied between the word line WL and the bit line BL.

Figure 20A:
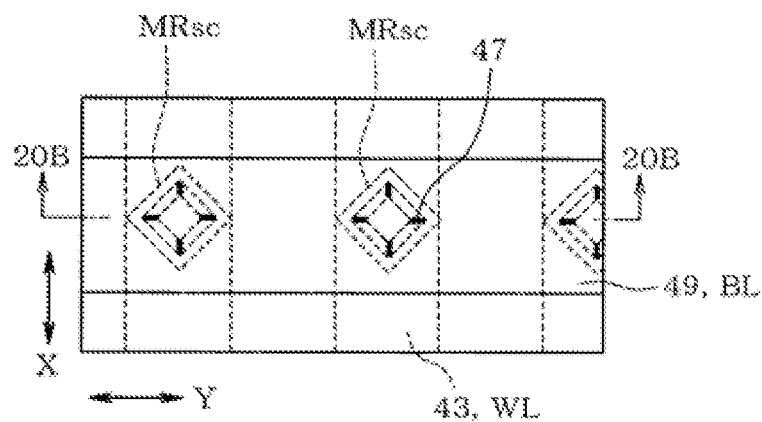
FIG. 20A is a schematic plan view illustrating a further different example of the memory cells MR.
Figure 20B:
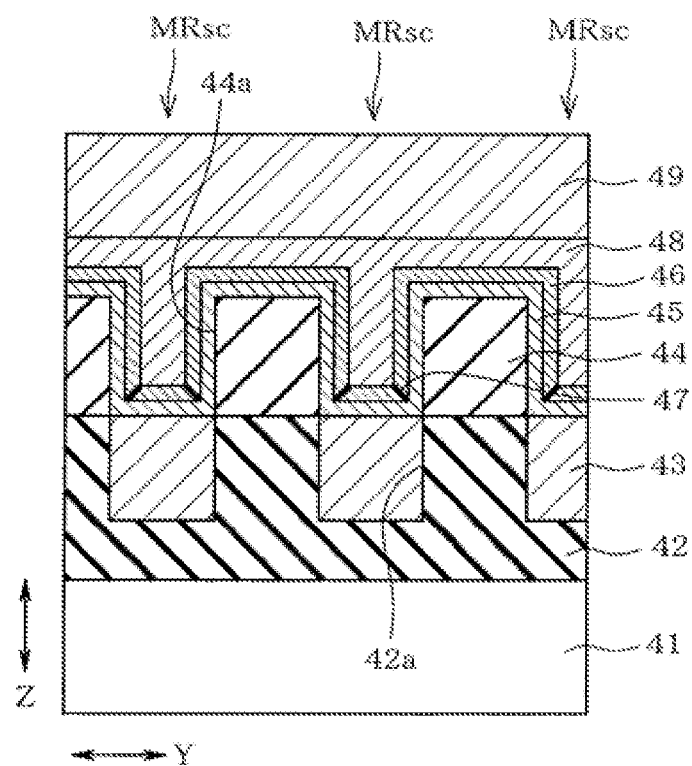
FIG. 20B is a longitudinal sectional view illustrating an example of a portion shown by the line 20B-20B of FIG. 20A.

FIGS. 20A and 20B illustrate a third modification example. In this embodiment, memory cells MRsc are disposed in place of the memory cells MRs. In this embodiment, the memory cells MTsc having the same configuration as the memory cell MRs are disposed so that all four corners are positioned on, i.e., overlie, the lower wiring layer 43. By disposing the memory cells as described above, all four of the seams 47 formed in the metal diffusion film 46 are disposed to be opposed to, i.e., overlie, the upper portion of the lower wiring layer 43. Accordingly, in the memory cell MRsa, all four of the seams 47 contribute to the switching operation when an electric field is applied between the word line WL and the bit line BL.

According to such modification examples, it is also possible to obtain effects similar to those of the third embodiment. In addition, by using any of the memory cells MRsa, MRsb, and MRsc in place of the memory cells MRs, the configuration in which the respective memory cells MRs use the same number of seams 47 may be employed, and variations in the switching characteristics between the elements may be reduced.

Fourth Embodiment

Figures 21A, 21B:
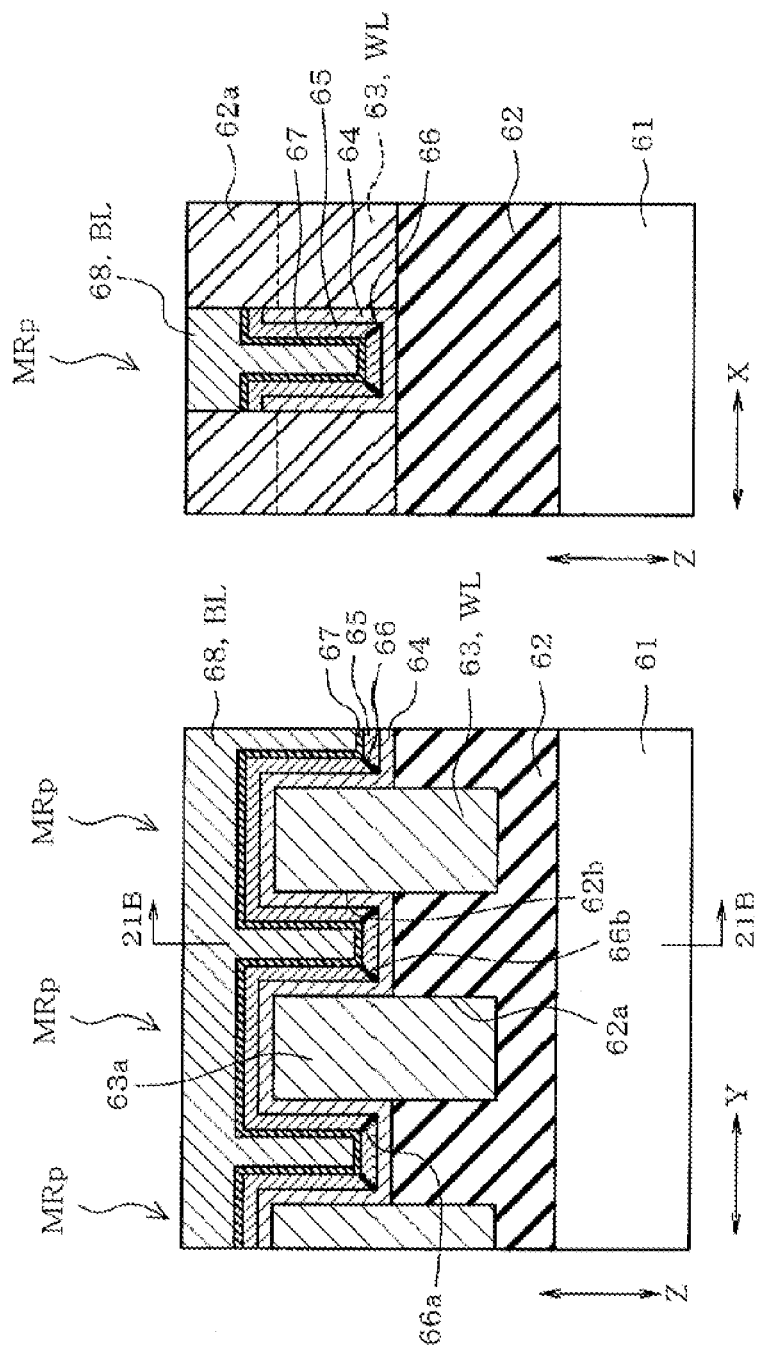
FIG. 21A is a longitudinal sectional view illustrating an example according to a fourth embodiment.
FIG. 21B is a longitudinal sectional view illustrating an example of a portion shown by the line 21B-21B of FIG. 21A.

FIGS. 21A and 21B illustrate a fourth embodiment. FIG. 21A illustrates a cross-section configuration of memory cells MRp, and is an example of a portion corresponding to FIG. 6B. FIG. 21B illustrates a cross-section configuration of a portion cut by the line 21B-21B in FIG. 21A. In this embodiment, the memory cells MRp have a configuration in which seams are provided between adjacent word lines WL.

In FIG. 21A, an insulating film 62 is disposed on a silicon substrate 61. For example, a silicon oxide film or the like may be used as the insulating film 62. Grooves 62a extending in the X-direction are provided in the insulating film 62 at predetermined intervals (spacing) in the Y-direction, and a lower wiring layer 63 forming the word line WL is embedded in the groove 62a. For example, a high melting point metal such as tungsten (W) may be used as the lower wiring layer 63.

In the cross-section illustrated in FIG. 21A, the lower wiring layer 63 extends in the Z-direction from the groove 62a to a position higher than a surface of the insulating film 62. The reason for this is that a rectangular recessed portion 62b in which the insulating film 62 is removed is formed at a position corresponding to the location where the bit line BL will be formed in the insulating film 62. As illustrated in FIG. 21B, this recessed portion 62b is surrounded by the insulating film 62 located to either side thereof in the X-direction and by the lower wiring layer 63 located to either side thereof in the Y-direction, and the insulating film 62 is exposed to a bottom surface portion thereof.

A variable resistance film 64 configuring a variable resistance layer is provided to cover upper surfaces of the insulating film 62 and the lower wiring layer 63 and an internal surface of the recessed portion 62. For example, a silicon oxide film ($SiO_x$) may be used as the variable resistance film 64. A metal diffusion film 65 also forming the variable resistance layer is provided on an upper surface of the variable resistance film 64. The metal diffusion film 65 is conformally formed along the internal wall surface of the recessed portion 62b. Slanted seams 66 are formed in portions where the bottom surface portion and the side wall surface of the metal diffusion film 65 in the recessed portion 62b come into contact with each other from the two directions. Here, in FIG. 21A, the seam 66 extends at a slant in the Y-Z plane and is formed to have a planar shape spreading in the Z-direction. As a result, four seams having a planar shape are formed along the side of the metal diffusion film 65. Two out of the four seams 66 are disposed with respect to two lower wiring layers 63 opposed to each other in the Y-direction. For example, a polycrystalline silicon film may be used as the metal diffusion film 65.

A metal supply layer 67 is provided on an upper surface of the metal diffusion film 65. The metal supply layer 67 is also formed on the surface of the metal diffusion film 65 in the recessed portion 62b. The metal supply layer 67 is formed such that a gap portion remains in the recessed portion 62b, but may also be formed to fill the recessed portion 62b. For example, a silver (Ag) film or the like may be used as the metal supply layer 67. An upper wiring layer 68 to form the bit line BL is provided on an upper surface of the metal supply layer 67. For example, a high melting point metal such as tungsten (W) may be used as the upper wiring layer 68. The upper wiring layer 68 becomes the bit line BT and is processed, together with the metal supply layer 67 and the metal diffusion film 65, to have a line shape extending in the Y-direction. An insulating film (not shown) such as a silicon oxide film is provided on both sides of the upper wiring layer 68, the metal supply layer 67, and the metal diffusion film 65 processed to have a line shape. Accordingly, the bit line BL is embedded in the insulating film.

According to the above-described configuration, the seam 66 formed in the metal diffusion film 65 is a region which has a lower density and a weaker chemical bond than other regions (for example, the metal diffusion film 65 excluding the seams 66). Accordingly, when an electric field is applied between the word line WL (lower wiring layer 63) and the bit line BL (upper wiring layer 68), silver which is a diffusion metal may be easily diffused and moved into the seam 66 in the metal diffusion film 65, and thus a low-voltage or low-current switching operation may be performed.

In this case, for example, when a potential difference is applied between the lower wiring layer 63a as a word line WL on the left side in FIG. 21 and the upper wiring layer 58, silver is diffused and moved into adjacent seams 66a and 66b on both sides in the lower wiring layer 63a. Accordingly, selective diffusion is performed in two planar seams 66a and 66b adjacent to each other in the Y-direction of the memory cell MRp, and thus variations in the switching characteristics between the elements may be remarkably reduced, compared to the related art in which the conductive bridge is randomly formed.

Fifth Embodiment

Figure 22:
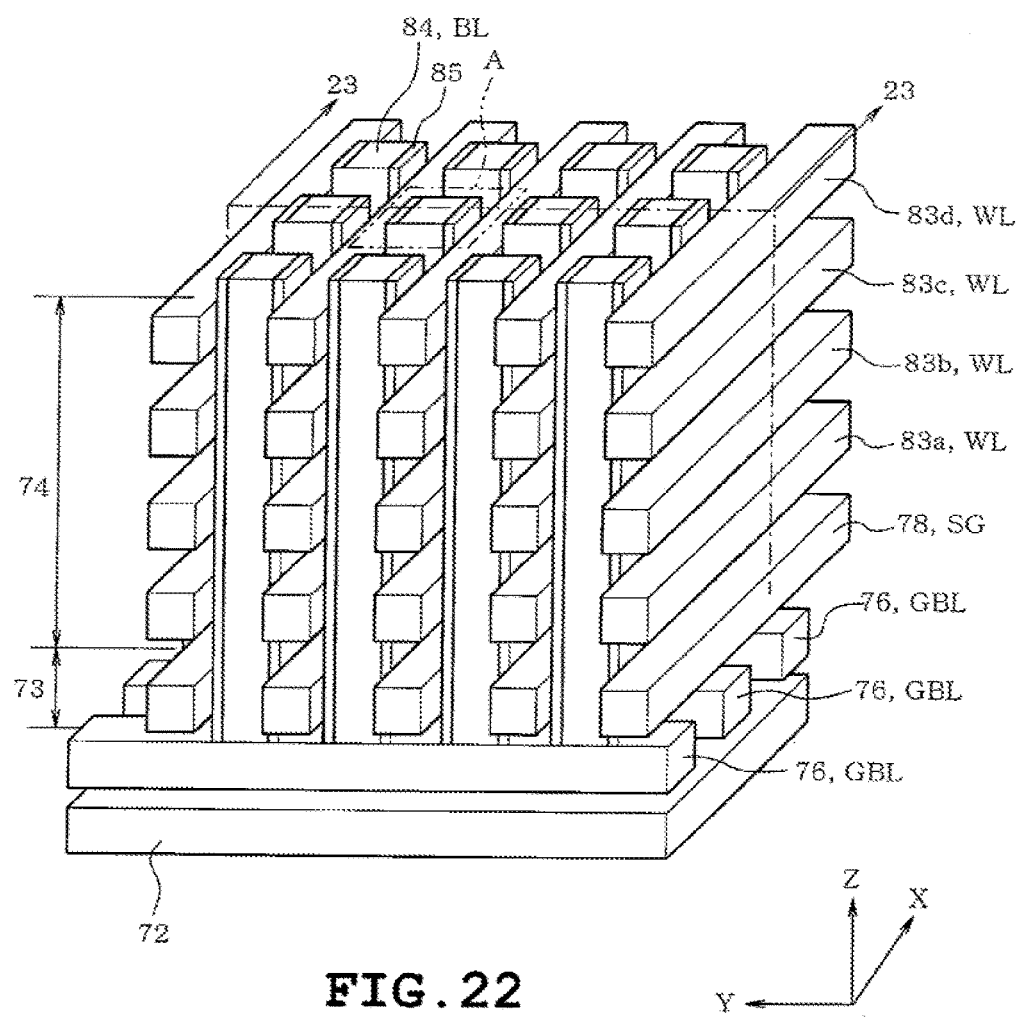
FIG. 22 is a perspective diagram illustrating an example of a lamination structure of a memory cell array according to a fifth embodiment.
Figure 23:
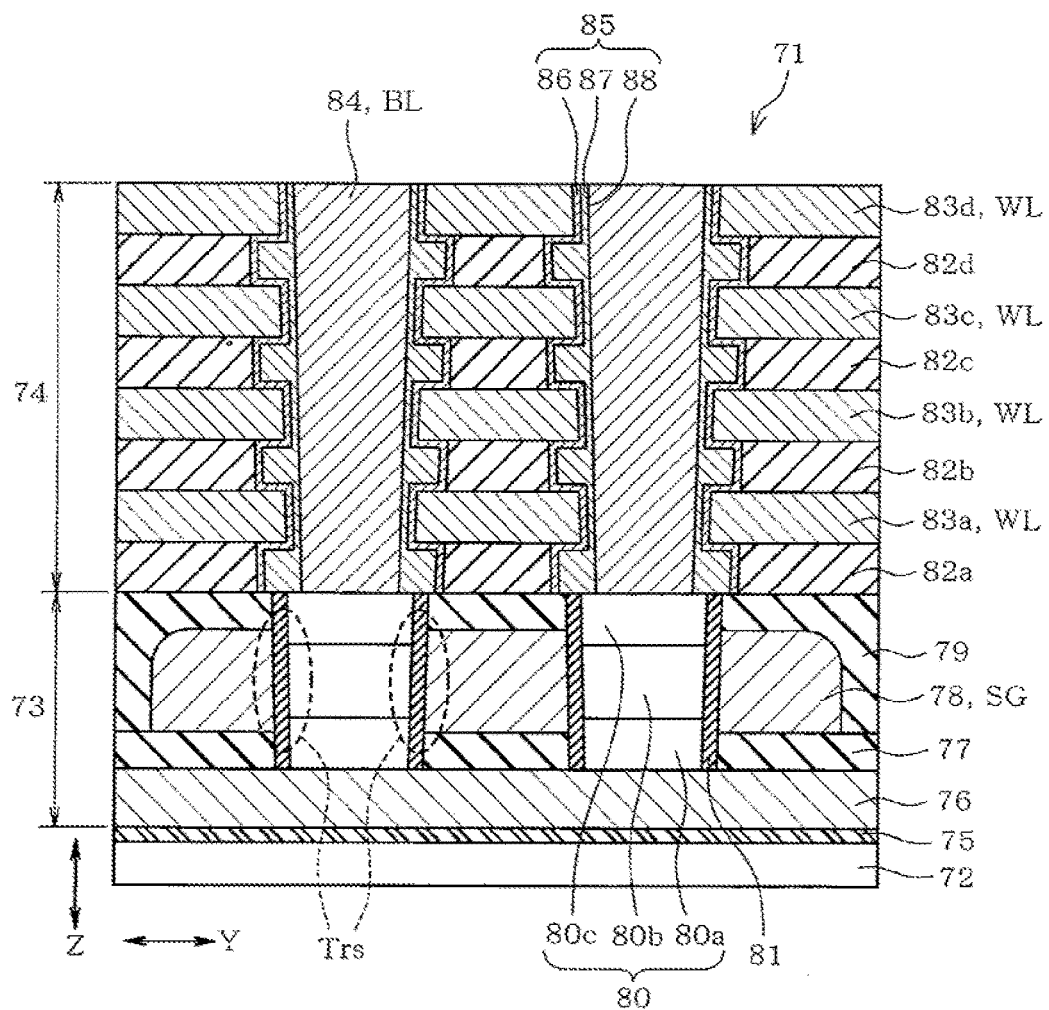
FIG. 23 is a longitudinal sectional view of a portion shown by the line 23-23 of FIG. 22, cut in a Z-direction.
Figure 24:
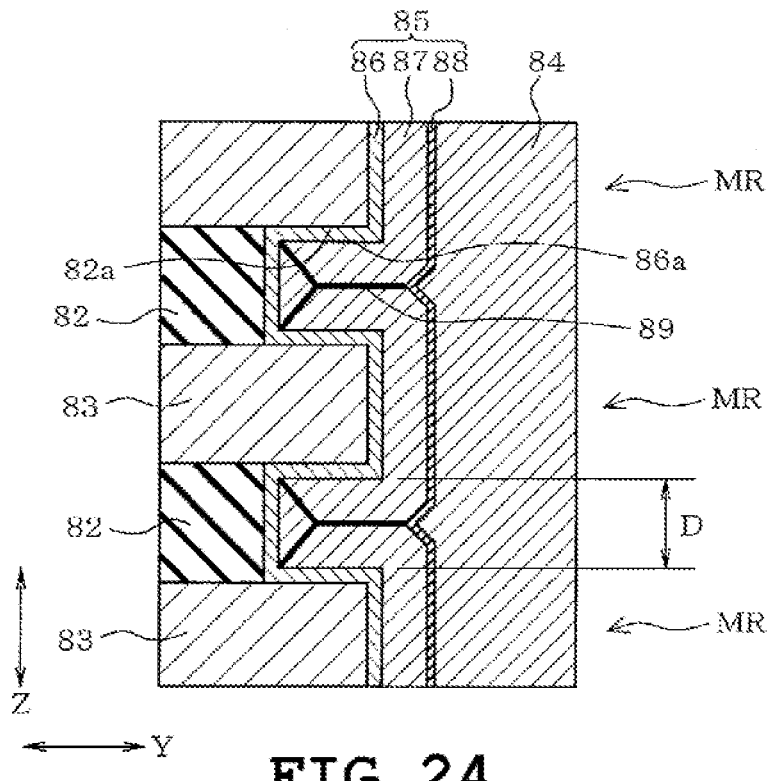
FIG. 24 is a longitudinal sectional view of a portion where memory cells MR are formed in FIG. 23.

FIGS. 22 to 24 illustrate a fifth embodiment. Here, a vertical bit line-type memory cell array 71 is applied as a configuration provided with memory cells MR. FIG. 22 illustrates a three dimensional array structure of the memory cell array 71. In FIG. 22, the interlayer insulating film is omitted. FIG. 23 illustrates a longitudinal sectional view of the memory cell array 71 when viewed in a direction of the arrow (X-direction), cut by a plane (a portion shown by the alternate long and short dash line) of a portion shown by the line 23-23 of FIG. 22.

As illustrated in FIGS. 22 and 23, the memory cell array 71 has: selection transistor layers 74 stacked one above the other on an insulating film 73 formed on a silicon substrate 72; and a memory layer 75. The selection transistor layer 74 is provided with a plurality of selection transistors TRs, and the memory layer 75 is provided with a plurality of memory cells MR.

The selection transistor layer 74 includes conductive layers 76, interlayer insulating films 77 (FIG. 23), conductive layers 78, and interlayer insulating films 79 formed in a Z-direction vertical to a main surface of the substrate 72. The conductive layer 76 functions as a global bit line GBL, and the conductive layer 78 functions as a selection gate line SG and as a gate electrode of a selection transistor Trs.

The conductive layers 76 are disposed at a predetermined pitch (spacing) in the X-direction and parallel to the main surface of the substrate 72, and extend in a Y-direction. The interlayer insulating film 77 is provided to cover portions of an upper surface of the conductive layer 76. The conductive layers 78 are disposed at predetermined intervals in the Y-direction and are disposed to extend in the X-direction. The interlayer insulating film 79 is provided to cover a side surface and an upper surface of the conductive layer 78, and a portion of the interlayer insulating film 77. For example, a polycrystalline silicon film may be used as the conductive layers 76 and 78. For example, a silicon oxide film ($SiO_2$) may be used as the interlayer insulating films 77 and 79.

In addition, the selection transistor layer 74 has columnar semiconductor layers 80 surrounded by gate insulating films 81. The columnar semiconductor layer 80 functions as a channel region of a selection transistor Trs, and the gate insulating film 81 functions as a gate insulating film for the selection transistor Trs.

The columnar semiconductor layers 80 are disposed in a matrix or array at predetermined intervals in the X-direction and in the Y-direction, and are provided to extend in a columnar shape in the Z-direction. The columnar semiconductor layer 80 is disposed to come into contact with the upper surface of the conductive layer 76 and to come into contact with the side surface of an end portion in the Y-direction of the conductive layer 78, with the gate insulating film 81 disposed therebetween. In addition, the columnar semiconductor layer 80 may be configured by laminating a high concentration n-type semiconductor layer 80a, a high concentration p-type semiconductor layer 80b, and a high concentration n-type semiconductor layer 80c on each other in that order.

The high concentration n-type semiconductor layer 80a is disposed in contact with the portion of the gate insulating film over the interlayer insulating film 77 in a side surface portion of an end portion in the Y-direction. The high concentration p-type semiconductor layer 80b is disposed to come into contact with portion of the gate insulating film overlying the side surface of the conductive layer the Y-direction. The high concentration n-type semiconductor layer 80c is disposed to come into contact with the portion of the gate insulating film overlying the interlayer insulating film 79. A polycrystalline silicon film containing n-type high concentration dopants injected thereto may be used as the high concentration n-type semiconductor layers 80a and 80c, and a polycrystalline silicon film containing p-type high concentration dopants injected thereto may be used as the high concentration p-type semiconductor layer 80b. For example, a silicon oxide film ($SiO_2$) may be used as the gate insulating film 81.

The memory layer 75 has interlayer insulating films 82 (82a to 82d) and conductive layers 83 (83a to 83d) alternately stacked one over the other in the Z-direction. The conductive layers 83 (83a to 83d) function as word lines WL1 to WL4, respectively. For example, a silicon oxide film ($SiO_2$) may be used as the interlayer insulating films 82 (82a to 82d), and for example, a polycrystalline silicon film may be used as the conductive layers 83 (83a to 83d).

The memory layer 75 also has columnar conductive layers 84 and side wall film portions 85. The conductive layers 84 are disposed in a matrix or array in the X-direction and in the Y-direction, and are provided to come into contact with the upper surfaces of the columnar semiconductor layer 80 and to extend in a columnar shape in the Z-direction. The conductive layer 74 functions as a bit line BL. The side wall film portion 85 is provided on a side surface of an end portion in the Y-direction of the conductive layer 84.

Although FIG. 22 briefly illustrates a configuration of the side wall film portion 85, the side wall film portion 85 has a variable resistance film 86, a metal diffusion film 87, and a metal supply layer 88 as illustrated in FIG. 23. The variable resistance film 86 and the metal diffusion film 87 configure a variable resistance layer. The ends of the interlayer insulating films 82 have recessed portions 82a which are positioned to be spaced further, in the Y direction, from the bit lines BL (conductive layers 84) than the adjacent ends of the conductive layers 83 (83a to 83d) in the and are surrounded between the conductive layers 83 vertically adjacent to each other in the Z-direction.

A configuration of a memory cell MR formed using a portion where the recessed portion 82a is formed will be described with reference to FIG. 24 illustrating the portion in detail. The variable resistance film 86 is provided along the surface of the conductive layer 83, and the surface of the conductive layer 83 or the surface of the interlayer insulating film 82 in the recessed portion 82a. For example, a silicon oxide film ($SiO_x$) may be used as the variable resistance film 86.

The metal diffusion film 87 is provided on a surface of the variable resistance film 86. The metal diffusion film 87 is formed to have such a thickness so as to fill the recessed portion 82a, i.e., a thickness of substantially half (D/2) a dimension D in the Z-direction of a portion 96a remaining by formation of the variable resistance film 86 on the upper and lower conductive layers 83 of the recessed portion 82a. In addition, the metal diffusion film 87 is conformally formed along the internal surface of the recessed portion 82a to form seams 89. For example, a polycrystalline silicon film may be used as the metal diffusion film 87.

Regarding the seam 89 of the metal diffusion film 87, the seams 89 are formed in a slanted direction in the Z-Y plane from respective angular portions between the surface of the interlayer insulating film 82 of the recessed portion 82a and the surfaces of the upper and lower conductive layers 83, and join as one seam 89 from the portion where the two seams 89 come into contact with each other and extends therefrom toward the opening portion of the recessed portion 82a to reach the surface portion of the metal diffusion film 87. In some cases, a depression remains corresponding to the position of the seam 89 in the surface portion of the metal diffusion film 87.

The metal supply layer 88 covers a surface of the metal diffusion film 87 to come into contact with the seams 89 in the depression portion of the metal diffusion film 87. For example, a silver (Ag) film or the like may be used as the metal supply layer 88. The conductive layer 84 is provided to come into contact with the metal supply layer 88.

According to the above-described configuration, the seam 89 formed in the metal diffusion film 87 is a region which has a lower density and a weaker chemical bond than other regions in the metal diffusion film 87 (for example, the metal diffusion film 87 excluding the seams 89). Accordingly, the silver (Ag) of the metal supply layer 88, which is a diffusion metal, may be easily and selectively diffused to the seam 89.

When a potential difference is applied between the word line WL (conductive layer 83) and the bit line BL (conductive layer 84), the silver which is a diffusion metal may be easily diffused and moved into the seam 89 in the metal diffusion film 87, and thus a low-voltage or low-current switching operation may be performed. Furthermore, since the silver which is a diffusion metal is selectively diffused into the seams 89 of the conductive layer 83, which become the memory cells MR vertically spaced in the Z-direction, variations in the switching characteristics between the elements may be drastically reduced, compared to a case in which the conductive bridge is randomly formed.

According to this embodiment, it is also possible to obtain effects similar to those of the first embodiment.

Sixth Embodiment

Figure 25:
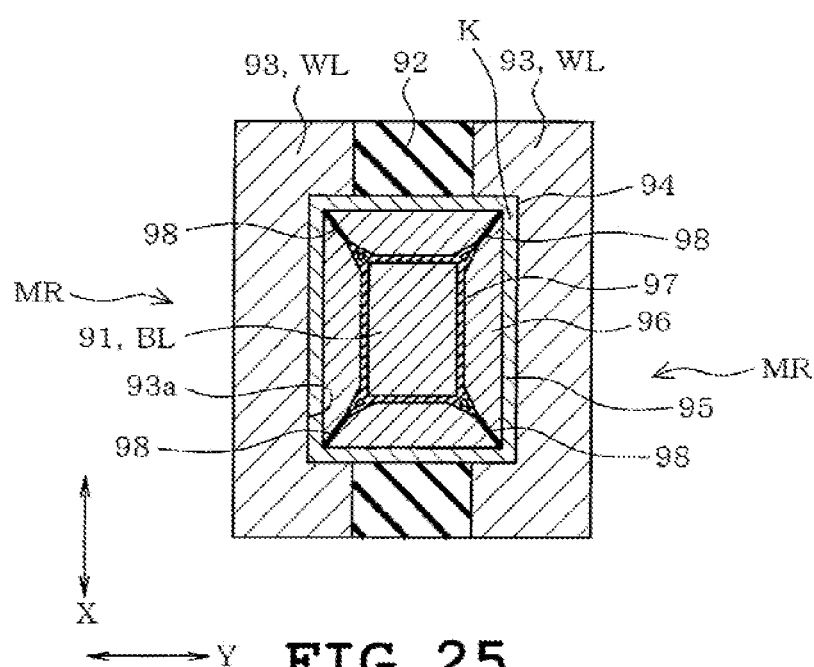
FIG. 25 is a cross-sectional plan view illustrating an example of a portion where a memory cell MR according to a sixth embodiment is formed.

FIG. 25 illustrates a sixth embodiment, and different portions from those in the fourth embodiment will be described. FIG. 25 illustrates a configuration of a memory cell MR applied to a vertical bit line-type memory cell array 71 as in the fifth embodiment. FIG. 25 is a horizontal sectional view illustrating an example of a portion where the memory cell MR is formed, cut by the X-Y plane. For example, FIG. 25 illustrates a plane cross-section of the region A of FIG. 22.

In FIG. 25, columnar conductive layers 91 each configuring a bit line BL are disposed in a matrix or array at predetermined intervals in a X-direction in a Y-direction, and extend to have a columnar shape in a Z-direction. An insulating film 92 is provided between the conductive layers 91 adjacent to each other in the X-direction. Conductive layers 93 forming word lines WL extend in the X-direction, with the conductive layer 91 interposed therebetween, are provided at predetermined intervals in the Y-direction. Here, it may be said that the bit line BL is formed inside an opening K formed in the word lines WL and the insulating film 92 interposed between the word lines WL.

A recessed portion 93a is formed by the opening K on one side surface side of the conductive layer 93. In the recessed portion 93a, a variable resistance film 95, a metal diffusion film. 96, and a metal supply layer 97 are sequentially laminated on the inner facing surface of the opening K. The conductive layer 91 is formed such that it is embedded through, and thus surrounded by, the metal supply layer 97.

The variable resistance film 95 is provided to cover the inside of the recessed portion 93a of the conductive layer 93 and the side surface of the insulating film 92. For example, a silicon oxide film ($SiO_x$) may be used as the variable resistance film 95. The metal diffusion film 96 is provided on the surface of the variable resistance film 95. The metal diffusion film 96 is provided to have such a thickness as to fill the recessed portion 93a. In addition, the metal diffusion film 96 is conformally formed along the internal surface of the recessed portion 93a to form seams 98. For example, a polycrystalline silicon film may be used as the metal diffusion film 96.

Regarding the seam 98 of the metal diffusion film 96, the seams 98 are formed in a slanted direction in the X-Y plane from respective angular portions between the surface of the variable resistance film 95 of the recessed portion 93a and the surface of the insulating film. The metal supply layer 97 is provided on the surface portion of the metal diffusion film 96. For example, a silver (Ag) film or the like may be used as the metal supply layer 97. The metal supply layer 97 is provided to come into contact with the periphery of the conductive layer 91.

According to the above-described configuration, the seam 98 formed in the metal diffusion film 96 is a region which has a lower density and a weaker chemical bond than other regions (for example, the metal diffusion film 96 excluding the seams 98). Accordingly, the silver (Ag) of the metal supply layer 97, which is a diffusion metal, may be easily and selectively diffused into the seam 98.

When a potential difference is applied between the word line WL (conductive layer 93) and the bit line BL (conductive layer 91), the silver which is a diffusion metal may be easily diffused and moved into the seam. 98 in the metal diffusion film 96, and thus a low-voltage or low-current switching operation may be performed. Furthermore, since the silver which is a diffusion metal is selectively diffused to two seams 98 corresponding to each memory cell MR, variations in the switching characteristics between the elements may be drastically reduced, compared to a case in which the conductive bridge is randomly formed.

By virtue of the above-described configuration, according to such a sixth embodiment, it is also possible to obtain effects similar to those of the first to fifth embodiments.

OTHER EMBODIMENTS

Other than those described in the above-described embodiments, the following modifications may be made.

As a material of the variable resistance film, polycrystalline or amorphous silicon, silicon oxide ($SiO_x$), silicon oxide nitride (SiON), silicon nitride (SiN), germanium (Ge), silicon-germanium (SiGe), gallium arsenide (GaAs), indium phosphide (InP), gallium phosphide (GaP), Gallium Indium Arsenide Phosphide (GaInAsP), gallium nitride (GaN), silicon carbide (SiC), hafnium silicate (HfSiO), hafnium oxide (HfO), aluminum oxide (AlO), or the like may be used. A lamination film of the above-described materials may also be used as the material of the variable resistance film.

As the metal diffusion film, for example, silver (Ag), gold (Au), titanium (Ti), nickel (Ni), cobalt (Co), aluminum (Al), iron (Fe), chromium (Cr), copper (Cu), tungsten (W), hafnium (Hf), tantalum (Ta), platinum (Pt), ruthenium (Ru), zirconium (Zr), or iridium (Ir), or nitride or carbide thereof may be used.

In addition, a material obtained by adding the above-described materials to polycrystalline silicon (Si) may also be used as the metal diffusion film.

In addition, a stop layer of tantalum silicon nitride (TaSiN) may also be inserted to the opposite side to the metal supplying film of the variable resistance film.

In the third embodiment, the polygonal prismatic recessed portion has a quadrangular or diamond-shaped prism shape, but another polygonal prism shape such as a triangular prism shape or a pentagonal prism shape may also be used. In addition, the shape of the recessed portion is not limited to the square shape. The recessed portion may also be formed to have a polygonal prism shape having unequal sides.

The configuration using the memory cells MR or MRs shown in the above-described embodiments may also be applied to non-volatile semiconductor memory devices having a configuration other than the configurations of the above-described embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
   a plurality of first wiring lines that extend in a first direction;
   a plurality of second wiring lines that extend in a second direction intersecting the first direction to cross the first wiring lines; and
   memory cells, each of which is provided where a first wiring line crosses a second wiring line,
   wherein each memory cell includes a variable resistance layer where the first wiring line crosses the second wiring line, a seam where portions of a material forming at least a portion of the variable resistance layer are in contact with each other, the seam extending in a direction along which the first wiring line and the second wiring line are spaced from one another, and a metal supply layer contacting the variable resistance layer and the seam therein, and wherein the variable resistance layer further comprises a metal diffusion film and a variable resistance film, the seam extending through the metal diffusion film.

2. The device according to claim 1,
   wherein each of the plurality of memory cells include the same number of seams in the variable resistance layer.

3. The non-volatile semiconductor memory device according to claim 1,
   wherein the variable resistance layer is an amorphous film.

4. The non-volatile semiconductor memory device according to claim 1,
   wherein the seam has a linear shape.

5. The non-volatile semiconductor memory device according to claim 1, wherein the seam has a plane shape.

6. The non-volatile semiconductor memory device according to claim 1, further comprising:
   a plurality of seams in the variable resistance layer, wherein
   a pitch of the seams of the memory cells extending in the direction along the first wiring line and the second wiring line is constant.

7. The non-volatile semiconductor memory device according to claim 1, wherein a void is provided adjacent to the seam.

8. A non-volatile semiconductor memory device comprising:
   a plurality of first wiring lines that extend in a first direction;
   a plurality of second wiring lines that extend in a second direction intersecting the first direction to cross the first wiring lines; and
   memory cells, each of which is provided where the first wiring line crosses a second wiring line,
   wherein each memory cell includes a variable resistance layer, a seam where portions of a material forming at least a portion of the variable resistance layer are in contact with each other, a void portion in the variable resistance layer, and a metal supply layer contacting the variable resistance layer and the seam, and wherein the variable resistance layer further comprises:
   a variable resistance film; and
   a metal diffusion film within which is provided the void portion.

9. The non-volatile semiconductor memory device according to claim 8,
   wherein each of the plurality of memory cells have the same number of void portions in the variable resistance layer.

10. The non-volatile semiconductor memory device according to claim 8, wherein the portions of the material forming the variable resistance layer in contact with one another are located between the void portion and the metal supply layer.

11. The non-volatile semiconductor memory device according to claim 8,
    wherein the variable resistance layer is an amorphous film.

12. The non-volatile semiconductor memory device according to claim 8, wherein:
    portions of the material forming the variable resistance layer positioned adjacent to the void portion of the variable resistance layer are in contact with each other.

13. A non-volatile semiconductor memory device comprising:
    a plurality of first wiring lines that extend in a first direction;
    a plurality of second wiring lines that extend in a second direction which intersects the first direction; and
    memory cells, each of which is disposed in a portion extending between the intersection location of the first wiring line and the second wiring line, and has at least one corner,
    wherein each memory cell has a variable resistance layer, a seam where a portion of the material configuring at least a portion of the variable resistance layer is brought into contact with a metal supply layer in contact with the variable resistance layer and the seam, and wherein the variable resistance layer comprises a metal diffusion film and a variable resistance film, the seam is provided in the metal diffusion film, and wherein the metal diffusion film is a crystalline film.

14. The non-volatile semiconductor memory device according to claim 13,
    wherein each of the plurality of memory cells include the same number of corners.

15. The non-volatile semiconductor memory device according to claim 13,
    wherein the seam has a linear shape.

* * * * *